United States Patent
Thomas et al.

(10) Patent No.: US 10,948,551 B2
(45) Date of Patent: Mar. 16, 2021

(54) FAULT MONITORING SYSTEMS AND METHODS FOR DETECTING CONNECTIVITY FAULTS

(71) Applicant: QHi Group Limited, Harpenden (GB)

(72) Inventors: Daniel Thomas, Tetbury (GB); Ross Kennedy, Harpenden (GB); John Hope, Sheffield (GB)

(73) Assignee: QHi Group Limited, Harpenden (GB)

( * ) Notice: Subject to any disclaimer, the term of this patent is extended or adjusted under 35 U.S.C. 154(b) by 254 days.

(21) Appl. No.: 16/091,681

(22) PCT Filed: Apr. 6, 2017

(86) PCT No.: PCT/GB2017/050969
§ 371 (c)(1),
(2) Date: Oct. 5, 2018

(87) PCT Pub. No.: WO2017/174994
PCT Pub. Date: Oct. 12, 2017

(65) Prior Publication Data
US 2019/0170804 A1    Jun. 6, 2019

(30) Foreign Application Priority Data
Apr. 6, 2016   (GB) .................................... 1605864

(51) Int. Cl.
*G01R 31/69*    (2020.01)
*H02J 13/00*    (2006.01)
(Continued)

(52) U.S. Cl.
CPC ............. *G01R 31/69* (2020.01); *H01H 47/18* (2013.01); *H02J 13/0062* (2013.01);
(Continued)

(58) Field of Classification Search
CPC .................. G01R 31/69; H01H 47/18; H01H 2011/0068; H01H 2071/044;
(Continued)

(56) References Cited

U.S. PATENT DOCUMENTS 7,495,876 B2   2/2009  Dunne et al.
7,528,612 B2   5/2009  Gollhardt et al.
(Continued)

FOREIGN PATENT DOCUMENTS

EP   2600162 A2   6/2013
WO   01/48498 A1  7/2001
(Continued)

OTHER PUBLICATIONS

Patents Act 1977: Search Report under Section 17(5), Application No. GB 1605864.6, dated Oct. 3, 2016.
(Continued)

*Primary Examiner* — Kyle J Moody
(74) *Attorney, Agent, or Firm* — MacMillan, Sobanski & Todd, LLC

(57) ABSTRACT

A fault monitoring system detects connectivity faults in a device control centre. The fault monitoring system includes, for the or each control section, at least a first pair of temperature sensors adapted to detect the temperature of a first pair of terminals $(T_{L1\text{-}IN})$, $(T_{L1\text{-}OUT})$. The system includes a processor configured to receive the detected temperatures, calculate an IN-OUT difference, the IN-OUT difference being a difference between the temperatures of the first pair of terminals $(\Delta T_{L1})$, compare the calculated IN-OUT difference with a predetermined threshold value $(\Delta T^*_{L1})$, whereby a calculated difference IN-OUT $(\Delta T_{L1})$, greater than the predetermined threshold value $(\Delta T^*_{L1})$, is indicative of a connectivity fault at one of the first pair of
(Continued)

terminals, and to generate at least one output signal based on the results of the comparison.

21 Claims, 9 Drawing Sheets

(51) Int. Cl.
| | |
|---|---|
| *H01H 47/18* | (2006.01) |
| *H02B 1/36* | (2006.01) |
| *H01H 11/00* | (2006.01) |
| *H01H 71/04* | (2006.01) |

(52) U.S. Cl.
CPC ............... *H01H 2011/0068* (2013.01); *H01H 2071/044* (2013.01); *H02B 1/36* (2013.01); *Y02E 60/00* (2013.01); *Y04S 10/30* (2013.01); *Y04S 40/124* (2013.01)

(58) Field of Classification Search
CPC ............ H02J 13/0062; H02J 13/00034; H02J 13/00016; H02J 13/00002; Y04S 10/30; Y04S 40/124; Y02E 60/7838; Y02E 60/74; H02B 1/36; H02B 11/10; H02B 13/025; G01K 3/14; H02H 5/04; H02H 7/22
See application file for complete search history.

(56) References Cited

U.S. PATENT DOCUMENTS

| | | | |
|---|---|---|---|
| 10,427,550 B2* | 10/2019 | Martel | ............... G01R 31/50 |
| 2002/0191362 A1 | 12/2002 | Simms et al. | |
| 2004/0008460 A1 | 1/2004 | Engel | |
| 2005/0089079 A1 | 4/2005 | Engel | |
| 2007/0207656 A1 | 9/2007 | Miettinen | |
| 2008/0013596 A1 | 1/2008 | Dunne et al. | |
| 2010/0073839 A1 | 3/2010 | Baxter et al. | |
| 2015/0145523 A1* | 5/2015 | Harada | ............... H02M 7/02 |
| | | | 324/538 |
| 2019/0391198 A1* | 12/2019 | Minich | ............ G01R 22/068 |

FOREIGN PATENT DOCUMENTS

| | | |
|---|---|---|
| WO | 2010/070338 A1 | 6/2010 |
| WO | 2011/034253 A1 | 3/2011 |
| WO | 2011/034256 A1 | 3/2011 |
| WO | 2015/061001 A1 | 4/2015 |

OTHER PUBLICATIONS

PCT International Search Report and the Written Opinion, Application No. PCT/GB2017/050969 filed Apr. 6, 2017, dated Sep. 18, 2017.

* cited by examiner

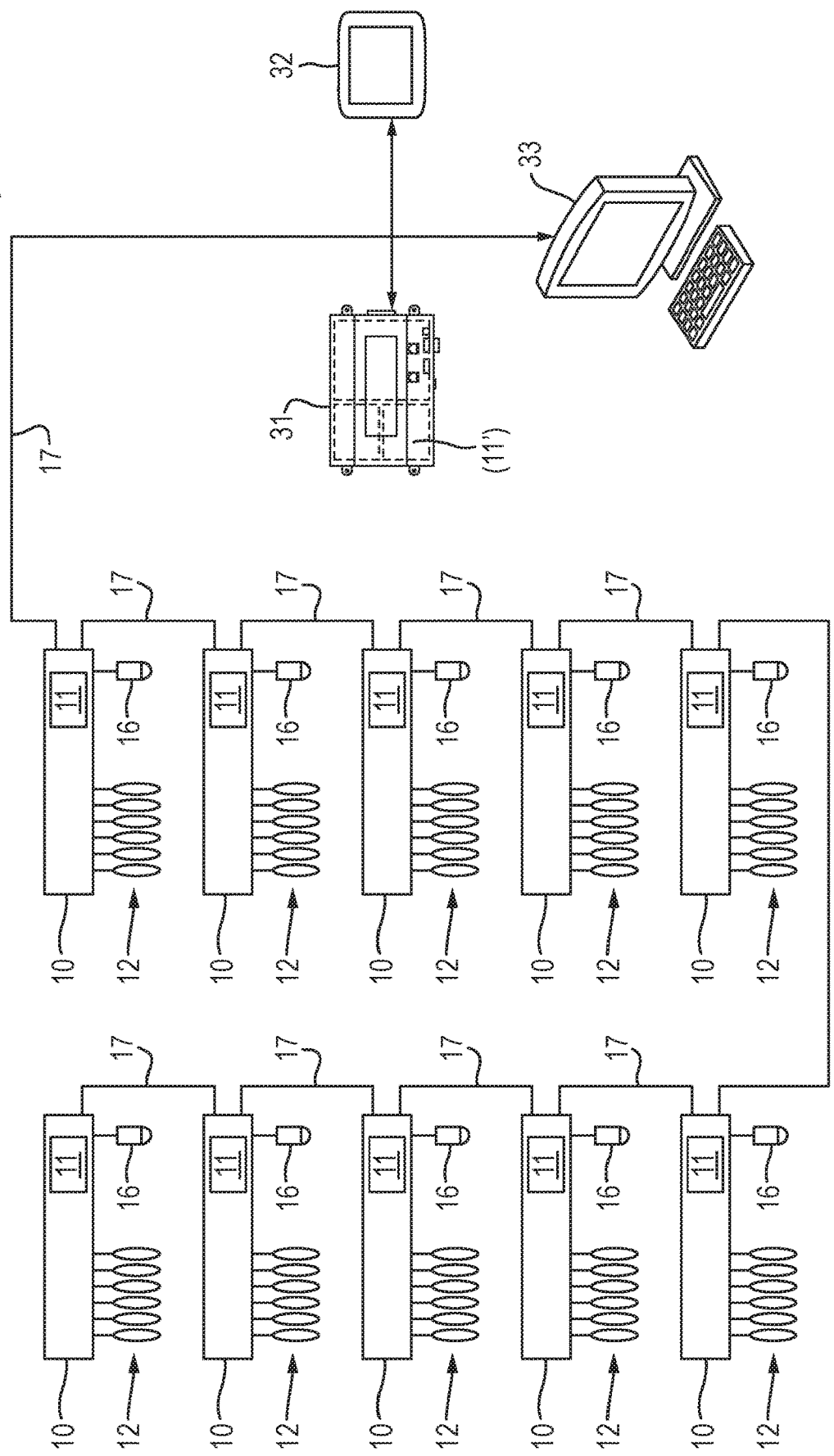

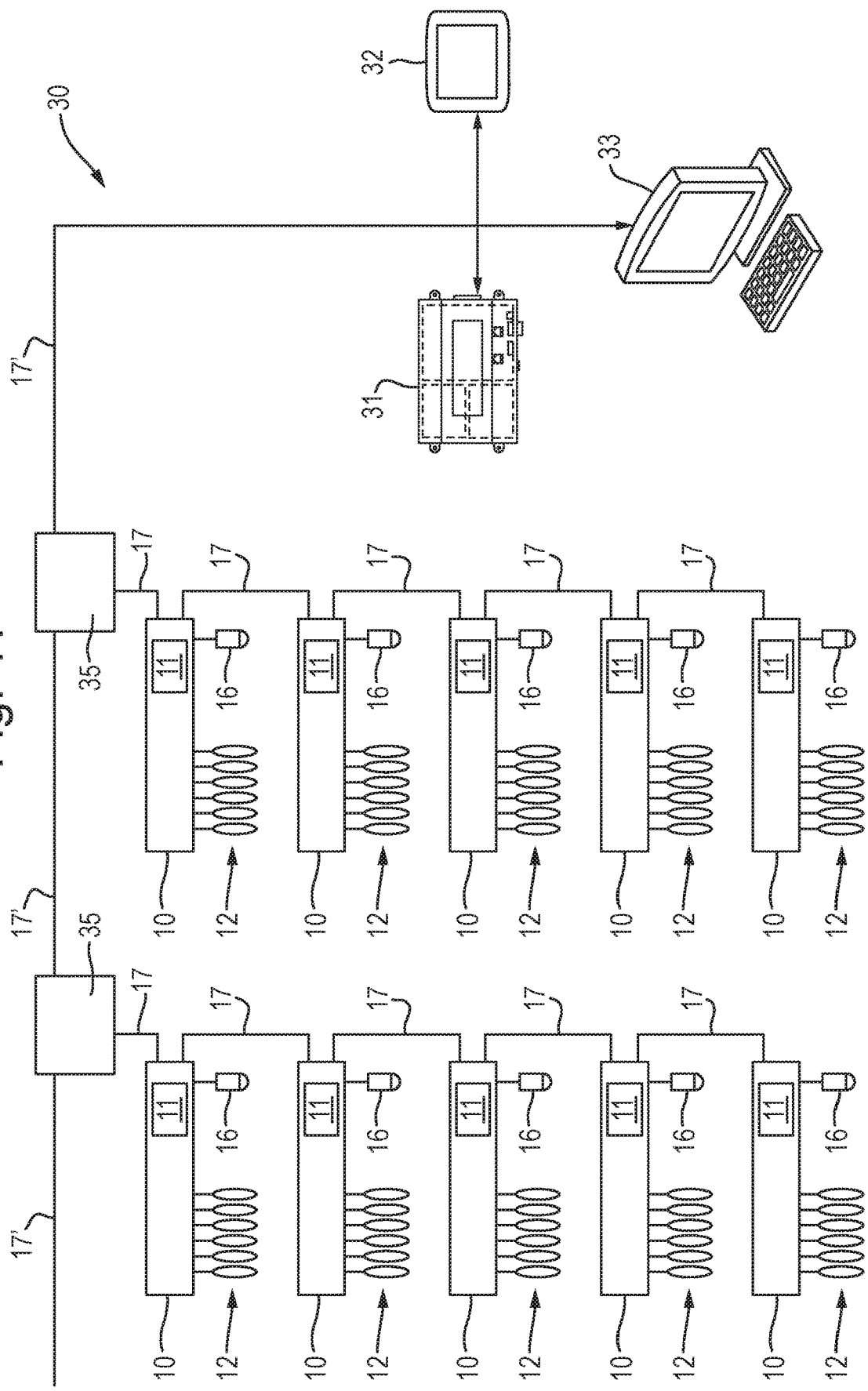

FAULT MONITORING SYSTEMS AND METHODS FOR DETECTING CONNECTIVITY FAULTS

CROSS-REFERENCE TO RELATED APPLICATIONS

This application is the National Phase of International Application PCT/GB2017/050969 filed Apr. 6, 2017, which designated the U.S. That International Application was published in English under PCT Article 21(2) on Oct. 12, 2017 as International Publication Number WO 2017/174994A1. PCT/GB2017/050969 claims priority to U.K. Application No. 1605864.6 filed Apr. 6, 2016. Thus, the subject nonprovisional application also claims priority to U.K. Application No. 1605864.6 filed Apr. 6, 2016. The disclosures of all of these applications are incorporated herein by reference.

BACKGROUND OF THE INVENTION

The present invention relates to fault monitoring systems and methods for detecting connectivity faults in device control centres such as motor control centres (MCCs), power distribution units (PDUs), circuit breakers, switch boards, fuse boards and the like. Also provided is a device control centre having such a fault monitoring system.

Electrical circuits are prone to faults which, if left unchecked, can deteriorate into connection failures. Where the circuit is subject to a high electrical load, as will typically be the case in commercial applications such as manufacturing sites, oil and gas processing facilities and data centres, a connection failure can give rise to an arc flash, resulting in significant explosion and fire, risking both personnel and surrounding infrastructure, as well as substantial downtime.

Indeed, one of the most common causes of production downtime in electrical equipment globally is recognised as connection failures which occur in device control centres. The term "device control centre" refers to electrical equipment located between a power source and once or more devices which is configured to control the supply of power to the device(s). Thus, examples of device control centres include motor control centres (MCCs), power distribution units (PDUs), circuit breakers, switch boards, fuse boards and the like. The device(s) under control could for example include motors, lighting circuits, pumps, refrigeration units, heating units, compressors, or any other devices which are electrically powered (or any combination thereof). The term "control" encompasses switching on and off power supply to the device as well as more complex processes such as adjusting the level of power supplied.

For example, motor control centres (which are so-named as they are commonly used to control a plurality of devices including motors, but here the term should not be construed as limited to this use) typically comprise a number of separate compartments, e.g. in the form of metal-enclosed cubicles, each containing one or more control sections which are each configured to control the power supply to a respective device (e.g. motor). Each control section comprises appropriate switchgear for controlling power to the respective device, e.g. for turning them on and off, starting and stopping motors, or varying operational parameters of the device such as the speed of a motor, etc. Examples of switchgear components which may be provided in the control sections include switches, circuit breakers, disconnectors, isolator switches, fuses, soft starters and the like. The control sections are typically low or medium voltage units. Each individual control section is normally housed in a case inside the compartment, which may be removable in order to enable easy maintenance. If the case is removable it is commonly referred to as a "drawer" whereas if it is non-removable (at least in everyday use) it is typically referred to as a "bucket". Each compartment typically holds a number of drawers or buckets, usually in a vertical column configuration, and multiple compartments may be arranged horizontally beside one another. Equivalently, each compartment may house a horizontal row of drawers or buckets and multiple compartments may be stacked vertically. The industry "average" number of cases (and hence control sections) is 8 per compartment, although they can vary between 3 up to 15 per compartment.

Power is supplied via one or more conductors (e.g. one for each of multiple power lines of different phase) for each compartment, which typically extend along the length of each compartment, e.g. vertically where the cases are arranged in columns. The control section within each case connects to the or each conductor at a respective power source side terminal and routes the power from each conductor to a respective device side terminal, to which the device is connected, via the switchgear. Particularly where the cases are removable (e.g. drawers), the connection(s) at the rear of the drawer to the vertical conductor (the power source side terminal(s)), are often a "plug in"-type connection, achieved via a set of spring loaded "jaws" which clamp onto the vertical conductor. Alternatively the connections may be of a "fixed" type using bolts.

Over time, the connection point between the "jaws" on the rear of the case and the vertical connector can become loose, often due to wear on the tension of the springs. Similar problems occur even in so-called "fixed" joints where the bolts or other connectors can become compromised (e.g. loosen) for a number of reasons, including the thermal dynamics caused by variable loads being applied to the circuit on which the joint resides. The result is a poor connection which will continue to deteriorate until failure. This input terminal between the vertical connector and the control section is acknowledged as a common point of failure. Modern MCC products often incorporate design features which inhibit the possibility of a phase to phase arc flash, such as physical barriers between the conductors. However, such features cannot stop the failure of an individual connection and the resultant damage to the components on the control section, and more seriously the consequential downtime. Further, there is an existing base of several million MCCs which are operational and date from a period prior to the introduction of phase to phase arc protection being implemented. These units are more prone to incidences of failure, due to the age and thus weakening of the spring tension on the "jaw" connectors at the rear of the drawer. Failure of these existing products will thus potentially have the more serious consequence of phase to phase arc flash which would result in significant explosion and fire, with the resulting increased risk of injury to personnel and damage to surrounding infrastructure, as well as more prolonged downtime.

It is therefore vital to monitor the condition of such electrical connections in order that joints which are compromised can be identified before failure occurs, and remedial action taken. One approach is to measure the temperature of each (e.g. vertical) conductor supplying power to the control sections, since if the connection at one of the terminals is faulty this will generate heat due to the increased resistance of the connection. However, the only solution currently available is to monitor the conductor at various discrete points (normally two or three points e.g. top, middle, bottom), typically using non-contact sensors (e.g. infrared). This relies on the excess heat generated by the poor connection between the "jaws" on the rear of the drawer and the vertical conductor being conducted along the vertical conductor, such that the temperature sensor monitoring it will detect the excess heat and initiate an alarm when that heat reaches a thermal alarm threshold. While this can be effective, it is increasingly difficult, and in many cases impossible, in modern MCC products because the vertical conductors are fully enclosed to prevent phase to phase arc flash. Even in MCC products where access to the vertical conductors remains open, the reliance on the excess heat being conducted is not ideal, since there are variables which can inhibit the conduction of the heat, e.g. air-cooled MCC compartments, size of the conductor etc. Further, by its nature the (typically copper) vertical conductor will dissipate heat along its length, introducing a thermal lag between the temperature at the faulty connection and the location of the temperature sensor, making accurate fault detection difficult.

Another method is to attempt to identify any poor connections at the rear of the cases (e.g. drawers) via periodic inspections using a thermal imaging camera to take a picture of those connection points. However, this would normally only take place as part of an annual maintenance program, e.g. one day per year. This represents less than 1% of operational uptime of a facility operating 24 hour production. In addition, it requires the drawer to be removed, which in itself initiates downtime for the device connected to the drawer, and thus interruption to the production process. Further, because the connection points are at the rear of the drawer, the air gap which exists within the drawer will make it virtually impossible to detect a poor connection.

Another alternative is to measure ambient air within the case, by placing an air temperature sensor within the case to detect a rise in the micro environment within the case, and comparing this against a pre-set threshold. However, as a result of the function of the control section (e.g. start/stop, vary speed etc.), the electrical load drawn through the control section will fluctuate and thus the ambient temperature will too, with the danger of either false alarming, or of no alarming when a fault exists. The system will also be susceptible to changes in the ambient temperature. Ultimately, detected temperatures increases due to prolonged high load or high ambient temperatures (which may not be a cause for alarm) cannot be distinguished from true alarm situations, i.e. those in which there is a low/medium electrical load but a significant fault exists. An example of such a system in the context of a circuit breaker is disclosed in U.S. Pat. No. 7,495,876.

A variant of this approach is to deploy multiple temperature sensors to detect the temperatures of particular components or connections within the case, rather than merely the air temperature, and examples of such systems are disclosed in U.S. Pat. No. 7,528,612 and WO-A-01/48498. However, this approach still suffers from false alarming due to the inevitable changes in load, and hence temperature, that the components or connections will experience during normal operation.

WO-A-2010/070338 discloses apparatus and systems for measuring the temperature of electrical cables and EP-A-2600162 discloses a method of predicting when an electrical joint is compromised in dependence on its electrical load.

Whilst the problems identified above have been discussed in the context of motor control centres, in fact much the same technical challenges exist in all types of device control centre. In general therefore, it would be desirable to provide a new system and method for monitoring and detecting electrical connectivity faults in such apparatus.

SUMMARY OF THE INVENTION

The present invention provides a fault monitoring system for detecting connectivity faults in a device control centre, the device control centre comprising at least one control section configured to control the supply of electrical power from a power source to a respective at least one device, the or each control section being electrically connected between the power source and the respective device at least a first pair of terminals, one of the first pair of terminals connecting the control section to of the power source side of a first power line and the other of the first pair of terminals connecting the control section to the device side of the first power line such that the control section completes the power circuit of the device, the fault monitoring system comprising:

for the or each control section, at least a first pair of temperature sensors, one of the first pair of temperature sensors being adapted to detect the temperature of one of the first pair of terminals ($T_{L1-IN}$), and the other of the first pair of temperature sensors being adapted to detect the temperature of the other of the first pair of terminals ($T_{L1-OUT}$);

a processor configured to receive the detected temperatures, calculate an IN-OUT difference the IN-OUT difference being a difference between the temperatures of the first pair of terminals ($\Delta T_{L1}$), compare the calculated IN-OUT difference with a predetermined threshold value ($\Delta T^*_{L1}$), whereby a calculated difference IN-OUT ($\Delta T_{L1}$) greater than the predetermined threshold value ($\Delta T^*_{L1}$) is indicative of a connectivity fault at one of the first pair of terminals, and to generate at least one output signal based on the results of the comparison; and an output module adapted to receive the output signal(s) generated by the processor and to communicate the output signal(s) externally.

Also provided is a method for detecting connectivity faults in a device control centre, the device control centre comprising at least one control section configured to control the supply of electrical power from a power source to a respective at least one device, the or each control section being electrically connected between the power source and the respective device at least a first pair of terminals, one of the first pair of terminals connecting the control section to of the power source side of a first power line and the other of the first pair of terminals connecting the control section to the device side of the first power line such that the control section completes the power circuit of the device, the method comprising:

for the or each control section, detecting the temperature of one of the first pair of terminals ($T_{L1-IN}$), and the other of the first pair of terminals ($T_{L1-OUT}$);

in a processor, calculating an IN-OUT difference, the IN-OUT difference being a difference between the temperatures of the first pair of terminals ($\Delta T_{L1}$), comparing the calculated IN-OUT difference with a predetermined threshold value ($\Delta T^*_{L1}$), whereby a calculated IN-OUT difference ($\Delta T_{L1}$) greater than the predetermined threshold value ($\Delta T^*_{L1}$) is indicative of a connectivity fault at one of the first pair of terminals, and generating at least one output signal based on the results of the comparison; and at an output module, receiving the output signal(s) generated by the processor and to communicate the output signal(s) externally.

The terms "device control centre", "device" and "control section" have the same meanings here as already discussed above.

The above-described fault monitoring system and method identify connectivity faults at the terminals connecting the control section(s) to the first power line by measuring the temperatures of the "IN" terminal (i.e. on the power source side of the control section) and of the "OUT" terminal (i.e. on the device side of the control section), and comparing the two. Since the two terminals connect the control section into the same power line, the current drawn through both of the terminals forming the first pair will be the same. Therefore, if the circuit is operating correctly, the temperature measured at each of the two terminals should be substantially the same. However, if the connection at one of the terminals is faulty, e.g. loose, the electrical resistance at that terminal will increase and hence its measured temperature will be different (higher) than that at the other terminal. The processor identifies whether such a fault is present by comparing the difference ($\Delta T_{L1}$) between the two measured temperatures against a stored threshold value ($\Delta T^*_{L1}$) which represents the maximum acceptable temperature difference between the two terminals, e.g. 10 degrees C. If the calculated temperature difference is greater than the predetermined threshold value, this is indicative of a connection fault. The processor generates output signal(s) based on the results for external communication (to an operator and/or an external device) by an output module, e.g. in order to alert an operator to a fault and/or to log the condition of the connections.

By using the difference between the temperatures of the "IN" and "OUT" terminals on any one power line in this way, the present system and method are able to more accurately determine the presence of a connectivity fault with reduced risk of false alarming. This is because the calculated temperature difference will not be affected by fluctuations in the load drawn by the device, or by changes in the ambient temperature.

In addition, the disclosed system and method do not require access to the vertical conductors from the rear of the device control centre. Rather the necessary components are capable of being fitted to, or adjacent to, the control section, e.g. inside a case such as a drawer or bucket of an MCC as described above, where space is extremely limited. The only components of the system which must be provided locally to the or each control section are the temperature sensors themselves. Typically these will be connected to a local circuit board which as described below will preferably also carry the processor, but in alternative scenarios the temperature sensors could transmit data (either directly or via the local circuit board) to a processor located elsewhere, via wired or wireless connections.

Since the necessary components can be fitted within each control section case, the disclosed system can be incorporated into any device control centre product, irrespective of the manufacturer, and is therefore vendor neutral and industry neutral. The system can either be integrated into the original design of the device control centre, or can be retro-fitted to existing device control centres, including those already in the field, irrespective of their age. As described below, the system is preferably configured so that it can be installed into a device control centre without the need for specialist skills beyond those expected of suitably qualified electrical technicians who would typically work on MCCs and other similar equipment.

The temperature sensors deployed to detect the temperature of each terminal can be implemented in a number of ways as discussed further below. However in all cases it should be appreciated that the point of temperature measurement could be on the termination itself between the control section and the power line, or could be adjacent the termination, on one of the cables which are connected at the terminal. In the latter case it is preferred that the temperature measurement is taken as close to the termination as possible for increased accuracy.

As already mentioned, the at least one device could be of various different types, including motors, lighting circuits, pumps, refrigeration units, heating units, compressors and the like. Some of the devices could operate on single phase power in which case the first power line may be the only power line. However, many devices require multi-phase power supply such as certain types of motor, such as three-phase motors. Therefore, in preferred embodiments, the fault monitoring system and method is adapted accordingly for multiple power lines. Preferably, the or each control section is additionally electrically connected between the power source and the respective device at a second pair of terminals and optionally at subsequent pair(s) of terminals, each of the second and optional subsequent pair(s) of terminals connecting the control section to the source side and device side of respective second and optional subsequent power line(s), the first, second and optional subsequent power lines carrying power with different respective phases $L_1$, $L_2$ . . . $L_m$, and the fault monitoring system further comprises:

for the or each control section, a second pair of temperature sensors, one of the second pair of temperature sensors being adapted to detect the temperature of one of the second pair of terminals ($T_{L2\text{-}IN}$), and the other of the second pair of temperature sensors being adapted to detect the temperature of the other of the second pair of terminals ($T_{L2\text{-}OUT}$); and optionally subsequent pair(s) of temperature sensors, one of each subsequent pair of temperature sensors being adapted to detect the temperature of one of each respective subsequent pair of terminals ($T_{Ln\text{-}IN}$), and the other of the subsequent pair of temperature sensors being adapted to detect the temperature of the other of the respective subsequent pair of terminals ($T_{Ln\text{-}OUT}$);

wherein the processor is further configured to calculate the IN-OUT difference between the temperatures of the terminals in the second and in any subsequent pair of terminals ($\Delta T_{L2}$ . . . $\Delta T_{Lm}$), compare the or each calculated IN-OUT difference with a predetermined respective threshold value ($\Delta T^*_{L2}$ . . . $\Delta T^*_{Lm}$), whereby a calculated IN-OUT difference ($\Delta T_{L2}$ . . . $\Delta T_{Lm}$) greater than the corresponding predetermined threshold value ($\Delta T^*_{L2}$ . . . $\Delta T^*_{Lm}$) is indicative of a connectivity fault at one of the respective pair of terminals, and to generate at least one output signal based on the results of the comparison.

Thus, the IN-OUT calculation is performed for each of the plurality of power lines, the temperature of the IN terminal on each power line being compared against that of the OUT terminal on the same power line. As discussed above, these should be approximately equal to one another unless there is a fault.

Any number of such power lines could be provided, depending on the device requirements. Preferably, therefore, the fault detection system will include a respective pair of temperature sensors for each power line. In particularly preferred implementations, three phase power will be provided via first, second and third power lines, as will be suitable for operating devices such as three phase motors. Hence, the or each control section is preferably electrically connected between the power source and the respective device at each of three pairs of terminals, each of the three pair(s) of terminals connecting the control section to the source side and device side of respective first, second and third power line(s), the first, second and third power lines carrying power with different respective phases $L_1$, $L_2$, $L_3$, and the fault monitoring system comprises:

for the or each control section, three pairs of temperature sensors, one of each pair of temperature sensors being adapted to detect the temperature of one of each respective pair of terminals ($T_{Lm\text{-}IN}$), and the other of the subsequent pair of temperature sensors being adapted to detect the temperature of the other of the respective subsequent pair of terminals ($T_{Lm\text{-}OUT}$);

wherein the processor is configured to calculate a terminal difference the terminal difference being a difference between the temperatures of the terminals in each of the three pairs of terminals ($\Delta T_{L1}$, $\Delta T_{L2}$, $\Delta T_{L3}$), compare the or each calculated terminal difference with a predetermined respective threshold value ($\Delta T^*_{L1}$, $\Delta T^*_{L2}$, $\Delta T^*_{L3}$), whereby a calculated terminal difference greater than the corresponding predetermined threshold value is indicative of a connectivity fault at one of the respective pair of terminals, and to generate at least one output signal based on the results of the comparison.

Depending on the device requirements, the power supply may or may not require the inclusion of a neutral (return) line. Typically, if the device operates on single phase power then a neutral line will be provided. If the device operates on multi-phase power (i.e. two or more power lines are provided) then the provision of a neutral line is optional. In all cases, the neutral line could pass through the control section in the same way as the above-mentioned power lines but alternatively the neutral line could bypass the control section. If such a neutral line is provided and is connected across the control section, preferably the fault monitoring system is further expanded to monitor the additional connections. Hence in preferred embodiments, the or each control section is additionally electrically connected between the power source and the respective device at a further pair of terminals, the further pair of terminals connecting the control section to the source side and device side of a neutral power line ($L_n$), and the fault monitoring system comprises:

for the or each control section, a further pair of temperature sensors, one of the further pair of temperature sensors being adapted to detect the temperature of one of the further pair of terminals ($T_{Ln\text{-}IN}$), and the other of the further pair of temperature sensors being adapted to detect the temperature of the other of the further pair of terminals ($T_{Ln\text{-}OUT}$);

wherein the processor is further configured to calculate a neutral difference, the neutral difference being a difference between the temperatures of the terminals in the further pair of terminals ($\Delta T_{Ln}$), compare the calculated neutral difference with a predetermined respective threshold value ($\Delta T^*_{Ln}$), whereby a calculated neutral difference greater than the corresponding predetermined threshold value is indicative of a connectivity fault at one of the further pair of terminals, and to generate at least one output signal based on the results of the comparison.

The so-called "IN-OUT" fault detection technique described so far can be supplemented in preferred embodiments by providing the fault detection system and method with additional functionality. Such optional additional functions could provide, for example, extra information as to the status of the terminals, and/or act as failsafe alarm modes. For instance, in a particularly preferred embodiment, the processor is further configured to compare the detected temperature of each terminal ($T_{L1\text{-}IN}$, $T_{L1\text{-}OUT}$, . . . ) against a respective predetermined threshold value ($T^*_{L1\text{-}IN}$, $T^*_{L1\text{-}OUT}$, . . . ), whereby a detected temperature greater than the corresponding predetermined threshold value is indicative of a connectivity fault at the respective terminal, and to generate at least one output signal based on the results of the comparison. This is referred to for convenience as the "HIGH" fault detection technique since it will indicate a connectivity fault whenever the measured temperature of a terminal is higher than the stored threshold value.

As discussed in relation to conventional systems, the "HIGH" approach has the disadvantage that its outcome will be susceptible to fluctuations in the load on the power supply and to changes in the ambient temperature. However, in combination with the "IN-OUT" approach already discussed it provides useful additional information as to the state of the terminals and in particular provides a useful failsafe mechanism if the predetermined thresholds are set suitably high (e.g. 70 degrees C.) such that relatively small changes in the measured temperature do not trigger a fault indication. In this case the IN-OUT output will remain the primary indicator of a connectivity fault but if for any reason the IN-OUT function should fail to detect a fault, the HIGH function will be triggered and indicate a fault as soon as the temperature of any terminal reaches the pre-set threshold. This could occur for example in the rare scenario in which both the IN and the OUT terminals on one power line develop a fault simultaneously such that both of their temperatures rise by the same amount. This would not be detected by the IN-OUT function but would be identified by the preferred but optional additional HIGH function.

In another variant, the sensitivity of the HIGH function to changes in ambient temperature can be reduced or eliminated by referencing the measured temperature of each terminal against a measurement of the ambient temperature. Hence, preferably, the fault monitoring system further comprises an ambient temperature sensor, adapted to detect the ambient temperature ($T_{AMB}$), and the processor is further configured to compare the detected temperature of each terminal ($T_{L1\text{-}IN}$, $T_{L1\text{-}OUT}$, . . . ) relative to the detected ambient temperature $T_{AMB}$ against a respective predetermined threshold value ($T^*_{L1\text{-}IN/AMB}$, $T^*_{L1\text{-}OUT/AMB}$, . . . ), whereby a detected relative temperature greater than the corresponding predetermined threshold value is indicative of a connectivity fault at the respective terminal, and to generate at least one output signal based on the results of the comparison.

Advantageously, the fault monitoring system and method can be further adapted to provide additional information as to the status of the power supply which is not indicative of connectivity faults at the control sections. For example, where the power supply is a multi-phase power supply, the fault monitoring system can be configured to detect phase imbalance—that is, a difference between the power level supplied on each of the power lines. Phase imbalance is typically the result of a fault in the power supply itself, e.g. as may be caused by operator error at the power source.

Imbalance between phases can cause substantial damage to multi-phase powered devices, such as motors, and significantly reduces their lifetime.

Therefore, in particularly preferred embodiments, where first and second power lines are provided, the processor is further configured to calculate an imbalance difference, the imbalance difference being a difference ($\Delta T_{L1/L2\text{-}IN}$) between the temperatures of the power source side terminal of the first power line ($T_{L1\text{-}IN}$) and the power source side terminal of the second power line ($T_{L2\text{-}IN}$), and/or a difference ($\Delta T_{L1/L2\text{-}OUT}$) between the temperatures of the device side terminal of the first power line ($T_{L1\text{-}OUT}$) and the device side terminal of the second power line ($T_{L2\text{-}OUT}$), and to compare the calculated imbalance difference with a predetermined respective threshold value ($\Delta T^*_{L1/L2\text{-}IN}$ and/or $\Delta T^*_{L1/L2\text{-}OUT}$), whereby a calculated imbalance difference greater than the corresponding predetermined threshold value is indicative of an imbalance between the power supplied on the first power line and the power supplied on the second power line, and to generate at least one output signal based on the results of the comparison.

More generally, where any plural number of power lines are provided, the processor is preferably further configured to calculate the imbalance differences ($\Delta T_{Lx/Ly\text{-}IN}$) between the temperatures of the power source side terminals of each power line ($T_{Lx\text{-}IN}$) and the power source side terminals of every other power line ($T_{Ly\text{-}IN}$), and/or the imbalance differences ($\Delta T_{Lx/Ly\text{-}OUT}$) between the temperatures of the device side terminals of every power line ($T_{Lx\text{-}OUT}$) and the device side terminals of every other power line ($T_{Ly\text{-}OUT}$), and to compare each calculated imbalance difference with a predetermined respective threshold value ($\Delta T^*_{Lx/Ly\text{-}IN}$ and/or $\Delta T^*_{Lx/Ly\text{-}OUT}$), whereby a imbalance calculated difference greater than the corresponding predetermined threshold value is indicative of an imbalance between the power supplied on two of the power lines, and to generate at least one output signal based on the results of the comparison.

The above phase imbalance routine could be made available as standard in all processors implementing the disclosed system and method, but to save on processing capacity it may be enabled/disabled at the point of installation according to whether or not the device to which power is being supplied is a multi-phase device (particularly a multi-phase motor).

It will be noted that the IN-OUT routine, the HIGH routine and the phase imbalance routine each make use of various predetermined thresholds. These thresholds are stored by the processor (either in rewritable digital memory and/or using hardware or firmware) and could be factory-set or user-selectable. For example, where the processor resides on a computer with a user interface (or on a network connected thereto), the software may be configured to allow the user to input any threshold values appropriate for the circumstances, e.g. via a standard keyboard input. However, as discussed below in preferred embodiments the processor is provided locally to the control section, e.g. on a PCB, in which case its size will be limited. In such cases it is preferred to pre-program the processor with a plurality of options for the value of each threshold to be used in the various calculations. For instance, the options for the IN-OUT threshold(s) (e.g. $\Delta T^*_{L1}$, $\Delta T^*_{L2}$ and $\Delta T^*_{L3}$) may be: 10 degrees C., 14 degrees C., 18 degrees C., 22 degrees C., and so on, up to 38 degrees C. Likewise, the options for the HIGH threshold(s) (e.g. $T^*_{L1\text{-}IN}$, $T^*_{L1\text{-}OUT}$, etc.) may be: 55 degrees C., 60 degrees C., 65 degrees C., 70 degrees C., and so on, up to 90 degrees C. Similarly, the options for the phase imbalance threshold(s) (e.g. $\Delta T^*_{Lx/Ly\text{-}IN}$ and/or $\Delta T^*_{Lx/Ly\text{-}OUT}$) could be: 10 degrees C., 14 degrees C., 18 degrees C. and 22 degrees C. One or more switches or other suitable hardware could be provided on the circuit board carrying the processor to enable the installer to select which of the available options should be used for each threshold. In particularly preferred embodiments, DIP switches may be provided for this purpose. For example, a package of eight switches (each one having two available, settings 1 and 0) can be used to define eight options for the IN-OUT threshold, eight options for the HIGH threshold and four options for the phase imbalance threshold. The installer can select their desired threshold value(s) based on the circumstances of the installation, e.g. taking into account the likely ambient temperatures and the degree of sensitivity required of the fault monitoring system.

The output(s) from the processor can take various different forms and can be handled in a number of different ways, in order for example to alert an operator to the presence of a connectivity fault or phase imbalance (if the system is configured to detect imbalance), and/or to monitor and log the status of the terminals over time irrespective of the presence of a fault.

Thus, in preferred embodiments, the processor is adapted such that the at least one output signal generated by the processor includes at least one status signal which is an alarm signal if a connectivity fault at one of the terminals or an imbalance between two of the power lines is indicated, and is a no-alarm signal otherwise. One or more of the status signal(s) could provide an overall indication of the "health" of the control section, i.e. transitioning to an alarm signal should any fault or imbalance be indicated by the processor on any of the terminals or power lines. Alternatively a dedicated status signal could be provided for each of the different fault types and optionally imbalance that the system is configured to detect, e.g. one status signal indicating whether the IN-OUT function on the first power line is within the acceptable threshold, another status signal indicating the same in relation to the second power line, status signals for any HIGH functions provided, and so on. By providing individual outputs from each calculation in this way, different downstream actions can be taken in dependence on the nature of the fault and/or imbalance that has been detected.

The alarm signal(s) could be triggered immediately upon detection of a fault or imbalance by the processor. However, in preferred embodiments, the processor is adapted to change the at least one status signal from a no-alarm signal to an alarm signal only if the connectivity fault or imbalance is indicated for the duration of a predetermined period, preferably 60 seconds. In this way, false alarming caused by short temporary changes in the measured temperatures can be reduced or avoided. The predetermined period applied could be the same or different for each status signal. For instance, status signals based on the IN-OUT function or phase imbalance measurements may be configured to transition to an alarm signal after a relatively short period of time has elapsed, whereas status signals based on the HIGH function may be configured to transition to an alarm signal after a longer period at which the measured temperature is above the corresponding threshold, to help account for the inherent fluctuation in this measurement. The predetermined period(s) could be factory-set or could be user-selectable in a manner similar to that described above in relation to the threshold value(s).

In the above embodiments, the processor simply outputs signal(s) indicating the presence or absence of an alarm scenario. However, in addition or as an alternative, the processor may also output some or all of the measured or calculated temperature data. This is particularly desirable where the condition of the device control system is to be constantly logged. Hence, preferably, the processor is adapted such that the at least one output signal generated by the processor includes detected temperature data which preferably comprises any of: the detected temperatures of one or more of the terminals ($T_{L1-IN}$, $T_{L1-OUT}$, ... ), and/or one or more calculated temperature differences ($\Delta T_{L1}$, $\Delta T_{L2}$, $\Delta T_{L1/L2-IN}$, $T_{L1-IN/AMB}$, ... ). The output signal(s) could carry the detected temperature data in either analogue or digital form, as discussed further below.

The output module could simply provide means for communicating the output signal(s) to some external device or network, e.g. a user interface. However in preferred embodiments, the output module comprises at least one alarm device, preferably a visual and/or audio alarm device, which is controlled by the output signal(s) from the processor. Preferably, the processor is configured such that outputting of an alarm signal activates one or more of the at least one alarm devices. The one or more alarm devices could be configured to produce the same alarm irrespective of the nature of the fault or imbalance which the processor has detected, e.g. turning on a particular light or sounding a siren. This would be the case for example if the output signal were to consist solely of a single status signal indicating the presence of any fault or imbalance as mentioned above. However, preferably, the processor is configured to control the at least one alarm device to output a different alarm in dependence on which calculation performed by the processor indicates the connectivity fault or imbalance. For instance, the different alarms could distinguish between at which terminal a fault has been detected, and/or on which power line. For example, where the IN-OUT routine detects a fault on a certain power line, the processor will also be able to identify whether it is the IN or the OUT terminal that has the fault since this terminal will show the higher temperature reading.

Where the system is adapted to additionally perform the above-mentioned HIGH function and/or detect phase imbalance, the different alarms preferably also distinguish between:
 a connectivity fault indicated by a difference between the detected temperature of two terminals of the same pair of terminals ($\Delta T_{L1}$, $\Delta T_{L2}$, ... )—i.e. the IN-OUT function;
 a connectivity fault indicated by a detected temperature of a terminal ($T_{L1-IN}$, $T_{L1-OUT}$, ... ), optionally relative to a detected ambient temperature, being greater than a corresponding threshold, —i.e. the HIGH function; and
 an imbalance indicated by a difference between the detected temperature of two power source side terminals or two device side terminals ($\Delta T_{L1/L2-IN}$, $\Delta T_{L1/L2-OUT}$, ... )—i.e. phase imbalance.

The different alarms could for example take the form of lights with different colours or different locations, or of sirens with different sounds, or any combination of the two. In particularly preferred examples, the different alarms could be conveyed by activating at least one alarm device in accordance with a coded sequence. For example a light such as an LED could be controlled to blink or flash in accordance with one code to indicate the presence of a certain fault type at one terminal, and in accordance with a different second code to indicate the presence of the same fault type but at a different terminal. In still further examples, the alarm could comprise a display such as a liquid crystal display which may be controlled to display a certain message in dependence on the output signal(s), e.g. identifying the type of fault detected and/or its location. If the processor and output module are local to the control section, the alarm devices (or at least one of them) are preferably also local, e.g. wired to the processor and sited on the outside of any case in which the control section is contained.

Advantageously, the or each alarm device is a light source, preferably an LED, or a sounder, preferably a siren. In a particularly preferred implementation, the output module comprises either a plurality of light sources each emitting a different colour or a multi-coloured light source which is adapted to emit different colours under the control of the processor, preferably a three-colour light source. For example, each one of the colours could be used to indicate a different alarm type (IN-OUT, HIGH and phase imbalance). Each colour can then be caused to blink in accordance with a code to identify the terminal or power line giving rise to the alarm, as described above. Desirably, the at least one alarm device may be controlled by the output signal from the processor via a relay, preferably a dry contact relay.

In addition to controlling at least one alarm device (which is preferably local to the output module), the output module advantageously further provides a remote output channel, configured to output at least one of the output signals to a remote computer or network, preferably via a relay, most preferably a dry contact relay. In this way the system can notify both local and remote operators of an alarm substantially simultaneously.

As an alternative or in addition to the provision of one or more alarm devices and/or relay outputs, the output module may be configured to provide more advanced functionality enabling communication with the processor across a network. This can be used to control the processor (e.g. to set any of the above-mentioned predetermined thresholds) and/or to receive data from the processor (e.g. status signals and/or the measured or calculated temperature data). Preferably, therefore, the output module comprises a communications device configured to convert the output signal(s) to a network data protocol and to communicate the output signal(s) to an external device via a network, the network data protocol advantageously being a serial communications protocol, most preferably being MODBUS. MODBUS is preferred since it is a non-proprietary protocol widely supported by manufacturers in many industries, although other protocols with the same benefits are available and could be used instead. The communications device can be configured to communicate the output signals onto the network either via a wired connection or wirelessly. The local components of the system are preferably provided with a network address which again may be set using DIP switches or similar on a circuit board local to the control section.

As mentioned at the outset, the only components of the fault monitoring system which must be local to the control section are the temperature sensors. The processor and output module could be sited elsewhere in wired or wireless communication with the temperature sensors. Such implementations lend themselves well to the provision of one central processor and output module which receives and processors temperature measurements from multiple control sections, should the device control centre include them. Therefore in a preferred embodiment, where the device control centre comprises a plurality of control sections, the fault monitoring system comprises at least a first pair of temperature sensors for each control section, the processor being a central processor configured to receive the detected temperatures from the temperature sensors provided for each of the plurality of control section and the output module being a central output module. The processor could for example be provided by a computer on a system hosting the device control centre. Implementations with a central processor such as this are particularly appropriate where the fault monitoring system is included in the original design of the device control centre rather than retrofitted later.

However, in most scenarios it is preferred that the processor and output module are also provided locally to the control section, since this enables most straightforward fitting of the fault monitoring system to any device control centre without the need for complex wiring or the use of wireless communications. Hence, preferably the fault monitoring system comprises a fault monitoring module for each of the at least one control sections, each fault monitoring module comprising:

the at least a first pair of temperature sensors for the respective control section;

the processor, wherein the processor is a local processor configured to receive the detected temperatures from the at least a first pair of temperature sensors for the respective control section only; and the output module, wherein the output module is a local output module.

If the device control centre comprises a plurality of control sections, the fault monitoring system therefore comprises a respective plurality of fault monitoring modules. Each fault monitoring module typically takes the form of a circuit board or similar carrying the processor and optionally all or part of the output module, to which the temperature sensors are connected as described further below. The processor is typically pre-programmed with appropriate software for carrying out the functions already described above. The fault monitoring module can be fitted into a case containing the control section (such as a drawer or bucket). Power can typically be supplied to the processor from the control section (e.g. in the form of a low voltage DC power supply, typically between 12 and 24V) by connecting the processor to the control section. If a suitable power supply is not available from the control section, the fault monitoring module can include a suitable power adapter (e.g. AC to DC). The control section will also typically include a network communications connection and so, if the output module includes a communications module such as a MODBUS output, this can typically also be connected to the network via the control section. Hence in a preferred embodiment, the fault monitoring system comprises a network of fault monitoring modules and a controller, wherein each fault monitoring module comprises an output module as described above for communication with the controller across the network. Optionally, the network may further comprise at least one aggregator configured to aggregate communications between the controller and a subset of the fault monitoring modules.

In each fault monitoring module, the temperature sensors will typically have a wired connection to the processor. Each temperature sensor may be labelled so as to identify the terminal of which it is to measure the temperature. The temperature sensors could be permanently wired to the processor. However to allow easy replacement of temperature sensors and particularly the use of different lengths or types of wire between the processor and sensors, preferably the temperature sensors are connected to the processor by a connector assembly configured to enable the temperature sensors to be separable from and removably coupled to the processor. Each temperature sensor could be individually connectable to the processor—for instance the connector assembly could comprise a number of standard terminal blocks, one for each sensor. However, in more preferred embodiments, the connector assembly comprises a first multi-pin connection component to which the temperature sensors are coupled, and a second multi-pin connection component coupled to the processor, the first and second multi-pin connection components being configured for removable engagement with one another. Thus, all of the temperature sensors are formed into a single unit by virtue of their coupling to the first multi-pin connection component and can be "plugged in" to the processor in one step. This ensures the correct sensor cables are connected to the correct inputs/outputs on the processor, and reduces the potential for user error. In addition this approach allows for: simple, low cost testing of the sensors prior to shipment; reduced assembly time in the factory; shortened installation time and reduction of skills required by installers; improved quality of the connections between the sensors and the processor, and the ability to supply various different sensor cable lengths and/or UL variations ("UL" stands for "Underwriters Laboratory LLC", a body which sets safety standards for electrical devices and components and provides certification thereof).

In some preferred implementations, the temperature sensors will be hard-wired to the first multi-pin component. This minimises the number of parts required and offers the simplest installation process with the least opportunity for user error. However in other preferred embodiments the first multi-pin connection component comprises a plurality of connection points to which the respective temperature sensors are removably coupled. This allows the installer to select different cable lengths or types for each of the sensors individually if desired.

Preferably, each fault monitoring module comprises a housing containing the processor and optionally at least part of the output module. The housing is advantageously sized to fit inside typical MCC cases such as drawers and buckets alongside the control section. It is preferred that the housing has dimensions no larger than 80×60×20 mm. Preferably, the housing is configured to enable its mounting within a MCC case, e.g. to a DIN rail. The DIN mounting is preferably on the narrow (e.g. 20 mm) face of the housing.

The temperature sensors could be of various different types and a mixture of types could be employed within the fault monitoring system if desired. In some preferred embodiments, each temperature sensor comprises a non-contact temperature sensor, preferably a radiation thermometer. Non-contact sensors are particularly preferred in environments where the geometry of the terminal is such that placing a sensor in good thermal contact with the terminal is difficult, since a non-contact sensor can be placed in the general vicinity of the terminal and yet be arranged to detect the terminal temperature with a high degree of accuracy. However, in many cases it will be preferred that each temperature sensor comprises a direct contact temperature sensor, preferably a thermistor. Sensors such as these are typically lower cost and can be more robust than non-contact sensors. Where the terminal geometry does not permit a contact temperature sensor to be placed on the termination itself, it can be affixed to the cable adjacent to the termination.

If contact sensors are used, preferably one or each of the temperature sensors may be provided with a cover formed of a thermally insulating material, arranged to reduce heat transfer between the temperature sensor and the ambient environment relative to heat transfer between the temperature sensor and the respective terminal. For instance the cover could take the form of thermally insulating tape wrapped around the outside of the sensor and the terminal or cable on which the sensor is placed. Alternatively a sensor housing formed out of an insulating material such as plastic may be provided, the housing having a wall thickness between the sensor and the ambient environment which is greater than the wall thickness between the sensor and the terminal or cable on which it is placed. Such a housing could be affixed to the terminal or cable using a mechanical fixing such as a cable tie or via an adhesive, for example.

As mentioned at the outset, the fault monitoring system could be deployed in any form of device control centre. Most preferably, the device control centre is a motor control centre (MCC), power distribution unit (PDU), Power Distribution Cabinet (PDC), Power Control Cabinet (PCC), Remote Power Panel (RPP), fuseboard, circuit breaker or switchboard.

The present invention further provides a device control centre, comprising at least one control section configured to control the supply of electrical power from a power source to a respective at least one device, the or each control section being electrically between the power source and the respective device at least a first pair of terminals, one of the first pair of terminals connecting the control section to of the power source side of a first power line and the other of the first pair of terminals connecting the control section to the device side of the first power line such that the control section completes the power circuit of the device, and a fault monitoring system as described above, and optionally having any of the preferred features mentioned above. The fault monitoring can be integrally built into the device control centre or could be retrofitted to it.

In preferred implementations, the or each control section is housed in a separate case (such as a drawer or bucket) and is preferably removably coupled to at least the power source side of the first power line. Most preferably the device control centre comprises a plurality of control sections.

In particularly preferred implementations, there is provided a fault monitoring system for detecting connectivity faults in a device control centre, the device control centre comprising at least one control section configured to control the supply of electrical power from a power source to a respective at least one device, the or each control section being electrically connected between the power source and the respective device at a plurality of pairs of terminals, one of each pair of terminals connecting the control section to the power source side of a respective power line and the other of each pair of terminals connecting the control section to the device side of the respective power line such that the control section completes the power circuit of the device, the power lines carrying power with different respective phases L1, L2 . . . Lm, the fault monitoring system comprising:

for the or each control section, a plurality of pairs of temperature sensors, one of each pair of temperature sensors being adapted to detect the temperature of one of a respective pair of terminals (TL1-IN, TL2-IN TLn-IN), and the other of each pair of temperature sensors being adapted to detect the temperature of the other of the respective pair of terminals (TL1-OUT, TL2-OUT TLn-OUT); a processor configured to: receive the detected temperatures; calculate an IN-OUT difference, the IN-OUT difference being a difference between the temperatures of each pair of terminals ($\Delta$TL1, $\Delta$TL2 . . . $\Delta$TLm) and compare the or each calculated IN-OUT difference with a predetermined respective threshold value ($\Delta$T*L1, $\Delta$T*L2 . . . $\Delta$T*Lm), whereby a calculated IN-OUT difference ($\Delta$TL1, $\Delta$TL2 . . . $\Delta$TLm) greater than the corresponding predetermined threshold value ($\Delta$T*L1, $\Delta$T*L2 . . . $\Delta$T*Lm) is indicative of a connectivity fault at one of the terminals in the respective pair of terminals; compare the detected temperature of each terminal (TL1-IN, TL1-OUT, . . . ) against a respective pre-determined threshold value (T*L1-IN, T*L1-OUT, . . . ), whereby a detected temperature greater than the corresponding predetermined threshold value is indicative of a connectivity fault at the respective terminal; calculate an imbalance difference ($\Delta$TL1/L2-IN), the imbalance difference being a difference between the temperatures of two of the power source side terminals of the power lines and/or a difference ($\Delta$TL1/L2-OUT) between the temperatures of two of the device side terminals of the power lines, and compare the calculated imbalance difference with a predetermined respective threshold value ($\Delta$T*L1/L2-IN and/or $\Delta$T*L1/L2-OUT), whereby a calculated imbalance difference greater than the corresponding predetermined threshold value is indicative of an imbalance between the power supplied on the respective power lines; and, generate at least one output signal based on the results of one or more of the comparisons; and, an output module adapted to receive the at least one output signal generated by the processor and to communicate the at least one output signal externally.

The implementation provides a robust system which is able to detect a fault through the use of three innovate techniques in tandem, the combination providing a particular benefit. For example, the IN-OUT and HIGH techniques together identify connectivity faults particularly well, because the IN-OUT approach is not affected by ambient temperature fluctuation but carries a risk of not spotting a problem if both of the terminals in the pair happen to suffer a fault of the same time. The HIGH approach provides a safety net to catch this. likewise, the HIGH algorithm is affected by ambient temperature fluctuation, but the IN-OUT function is not. Together with monitoring for phrase imbalance, which compensates for error in the device, each algorithm identifies faults which the others may not such that together the system provides for identification of the faults that may be suffered by a motor control centre and the risk of catastrophic failure is reduced. The industry trend is to provide fault mitigation or there is an acknowledged prejudice against providing direct fault monitoring which has been considered not to be possible.

Examples of fault monitoring systems and methods in accordance with the present invention will now be described with reference to the accompanying drawings, in which:

BRIEF DESCRIPTION OF THE DRAWINGS

FIGS. 10 and 11 schematically illustrate two exemplary networks forming fault monitoring systems in further embodiments of the invention.

DESCRIPTION OF THE PREFERRED EMBODIMENTS

As discussed above, the presently disclosed fault monitoring system and method is suitable for deployment in any device control centre. Typically the device control centre will be configured to control a plurality of devices via a corresponding plurality of control sections. However the present system and method can equally be used in device control centres controlling a single device. Thus the principles of operation of the fault monitoring system and method will initially be described with reference to control of a single device but as will be seen the same technique can be employed in device control centres (e.g. MCCs, switchboards, power distribution centres etc.) with any number of devices.

Figure 1:
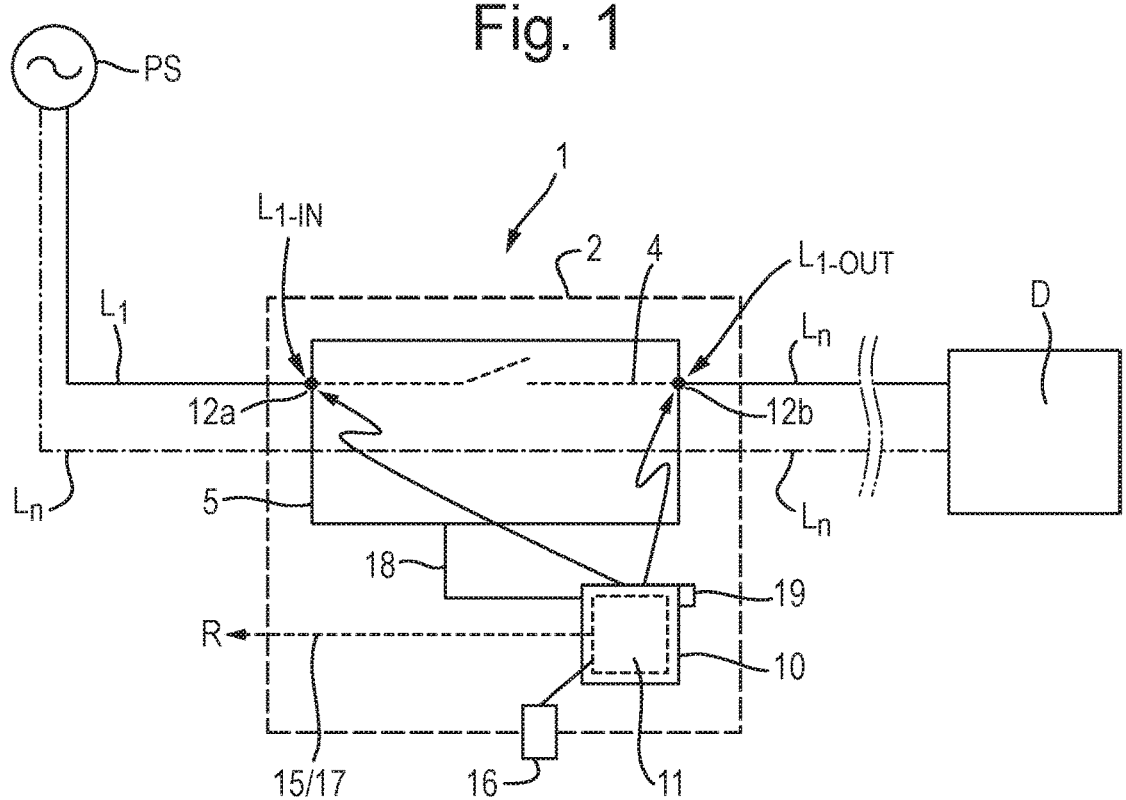
FIG. 1 shows a first embodiment of a fault monitoring system in an exemplary device control centre.

Therefore FIG. 1 illustrates a device control centre ("DCC") 1 configured to control the supply of power from a power source PS to a single device D. In this case the device D operates on single-phase power and thus is supplied with power via a single power line $L_1$. In this embodiment a return or neutral line $L_n$ is also present, but this is not required in all embodiments as discussed below. The device D could be a small pump circuit, for example. The DCC 1 includes a control section 5 connected between the power source side of the power line $L_1$ at a first terminal $L_{1\text{-}IN}$ and the device side of the power line $L_1$ at a second terminal $L_{1\text{-}OUT}$. The first and second terminals are referred to as a first pair of terminals since they are both on the same power line which the control section 5 completes. The control section 5 includes switchgear 4, which here is represented schematically as including a simple switch but in practice may include any suitable control components including switches, circuit breakers, disconnectors, isolators, fuses, soft-starters etc. The control section 5 is typically contained within a case 2 such as the drawers or buckets mentioned previously, but this is optional.

Provided locally to the control section 5 (and preferably within case 2) is a fault monitoring module 10 which in this embodiment constitutes the fault monitoring system but in other embodiments may form a part thereof as described further below. In this embodiment, the fault monitoring module 10 comprises a processor 11, first and second temperature sensors 12a, 12b and an output module here taking the form of an alarm device 16 and an optional remote output line 15/17 for outputting signals to a remote device or network R. Other optional features provided in the fault monitoring module 10 in this embodiment include a further temperature sensor 19 and a power supply 18 taken from the control section 5, both of which will be discussed below.

The temperature sensors 12a, 12b are arranged to measure the temperatures of the first and second terminals on the power line $L_1$. Thus, sensor 12a measures the temperature $T_{L1\text{-}IN}$ of the first terminal $L_{1\text{-}IN}$ and sensor 12b measures the temperature $T_{L1\text{-}OUT}$ of the second terminal $L_{1\text{-}OUT}$. In practice, depending on the type of temperature sensors used, the temperatures may be measured from one of the cables joined at the respective terminals rather than directly on the terminals themselves, but in this case the measurements are taken from points as close to the terminals as possible. The processor 11 receives temperature measurements from the sensors which are updated at regular intervals so as to provide substantially real-time, continuous monitoring. For example, the temperatures from the sensors should be detected at least every 60 seconds.

The processor 11 in this embodiment is pre-programmed to calculate the difference $\Delta T_{L1}$ between the measured temperatures $T_{L1\text{-}IN}$ and $T_{L1\text{-}OUT}$, and to compare the calculated difference $\Delta T_{L1}$ against a predetermined threshold value $\Delta T^*_{L1}$. The predetermined threshold value $\Delta T^*_{L1}$ is set such that a calculated value $\Delta T_{L1}$ greater than the predetermined threshold value $\Delta T^*_{L1}$ is deemed indicative of a connectivity fault at either one of the first and second terminals. Various methods for setting this and other predetermined threshold values for use by the processor are discussed below. Based on the comparison, the processor 11 generates at least one output signal which is communicated externally by an output module, here comprising a local alarm device 16, e.g. in the form of a light source such as an LED. Alternatively or in addition the output signal(s) may be transferred to a remote device or network R on line 15/17. The output signal(s) could for instance include a status signal which indicates the state of the terminals $L_{1\text{-}IN}$, $L_{1\text{-}OUT}$ by transitioning from a non-alarm signal to an alarm signal when the processor calculates a temperature difference $\Delta T_{L1}$ which is greater than the threshold $\Delta T^*_{L1}$. Preferably the alarm is "latching" meaning that should the calculated temperature difference $\Delta T_{L1}$ fall back below the threshold $\Delta T^*_{L1}$, the status signal will remain in an alarm condition until reset by an operator. To reduce the possibility of false alarming, the processor 11 may be configured to wait until the calculated temperature difference $\Delta T_{L1}$ has remained at a value greater than the threshold $\Delta T^*_{L1}$ for the duration of a predetermined time period before outputting an alarm signal, e.g. 60 seconds.

The local alarm device 16 is controlled by the output signal from the processor 11, e.g. in the case of a light source becoming illuminated when the status symbol is an alarm signal and remaining off otherwise (or vice versa) or the light source changing colour. The alarm device can also be controlled by the processor 11 to provide additional information such as identifying to the operator which terminal $L_{1\text{-}IN}$ or $L_{1\text{-}OUT}$ has the fault, since this will be the terminal having the higher of the two measured temperatures. The alarm device 16 could be controlled to output this information e.g. by being actuated in accordance with a code sequence—for instance in the case of a light source it may be configured to flash or blink in a certain first sequence to indicate that terminal $L_{1\text{-}IN}$ has the fault and to flash or blink in a different second sequence to indicate that terminal $L_{1\text{-}OUT}$ has the fault.

If a remote output line 15/17 is provided, this could simply output the same status signal, e.g. via a relay output. The remote device R could be a remote alarm device such as another light source or a siren, or could for instance be a computer, or a network of computers, having an appropriate graphical user interface configured so as to display the status of the terminals at control section 5 to a user, and to alert them to any alarm signal. Alternatively or in addition the output signals output on the remote line R could include the measured and/or calculated temperature data in which case this may be in the form of a serial data communications protocol such as MODBUS.

Optionally, in addition to the above-described "IN-OUT" function, the fault monitoring system may also be responsive to the individual measured temperatures of the first and second terminals ($T_{L1\text{-}IN}$ and $T_{L1\text{-}OUT}$), either absolute or referenced against the ambient temperature, which is referred to as the "HIGH" function. In the latter case the ambient temperature is measured by the further temperature sensor 19. The processor implements the HIGH function by comparing each measured temperature $T_{L1\text{-}IN}$ and $T_{L1\text{-}OUT}$ against respective predetermined thresholds $T^*_{L1\text{-}IN}$ and $T^*_{L1\text{-}OUT}$ (which may have the same value for each terminal, or could be different for each terminal), optionally referenced against the measured ambient temperature. If one (or more) of the measured temperatures $T_{L1\text{-}IN}$ and/or $T_{L1\text{-}OUT}$ is greater than the corresponding threshold, this is indicative of a connectivity fault at the respective terminal. Since the HIGH function is intrinsically vulnerable to false alarming due to unavoidable fluctuations in the load on the power line $L_1$ (and hence the temperatures of the terminals), the predetermined thresholds $T^*_{L1\text{-}IN}$ and $T^*_{L1\text{-}OUT}$ may be set relatively high in order to reduce the occurrence of false alarms and/or the processor 11 may be configured to output an alarm signal only after the measured temperature has remained above the corresponding threshold value for a certain time period, e.g. 60 seconds. The HIGH alarm may be communicated externally either by the same local alarm device 16 (preferably by actuating it in a different manner, e.g. causing it to illuminate in a different colour), or by another local alarm device such as a second light source (not shown), and/or on remote output line 15/17. The HIGH function provides a useful failsafe alarm generation in rare scenarios such as both terminals experiencing connectivity faults at the same time, in which case their temperatures would each rise simultaneously and potentially the IN-OUT function could fail to alarm.

It should be noted that whilst in this embodiment the local processor 11 performs the above-described IN-OUT calculation (and optionally the HIGH calculation) to determine whether a fault exists and to generate an output signal, in other embodiments these functions may be performed at a remote processor (not shown in FIG. 1), in which case the local processor 11 may have lesser functionality, e.g. simply conveying the measured temperatures $T_{L1\text{-}IN}$ and $T_{L1\text{-}OUT}$ to a remote device via remote output line 15/17 for further processing including performing the IN-OUT calculation (and optional HIGH calculation), and generating output signals. This may be preferred where there is a plurality of control sections 5 and corresponding fault monitoring modules 10 as described further below.

Power is preferably provided to the fault monitoring module 10 by a connection 18 to a power supply commonly available on the control section 5, e.g. a 12 or 24V DC supply. If the required voltage is not available directly the fault monitoring module may include a suitable converter. In still further embodiments the fault monitoring module could instead include an onboard power supply such as a battery.

In the FIG. 1 embodiment, the device D uses single phase power and hence there is a single power line $L_1$ and a neutral line $L_n$ to complete the circuit. It will be appreciated that the neutral line could be connected across the control section 5 in much the same manner as power line $L_1$, in which case corresponding switchgear 4 may or may not be provided to connect and disconnect the neutral line $L_n$. However, this is not essential since power supply to device D can be controlled by controlling the switchgear on line $L_1$ only (given that this will open/close the circuit as a whole). Equivalently, the switchgear 4 could be located on the neutral line $L_n$ only and not on line $L_1$ with the same effect. Thus, the neutral line $L_n$ can if desired bypass the control section 5 (and compartment 5) entirely, and may be hardwired. If the neutral line $L_n$ is connected across the control section 5, it is preferred that the pair of terminals at which it connects to the control section 5 have their temperatures monitored by additional temperature sensors 12 (not shown) provided in the fault monitoring module 10 so that any connection fault on the neutral line $L_n$ can also be detected using the same principles as discussed above.

Figure 2:
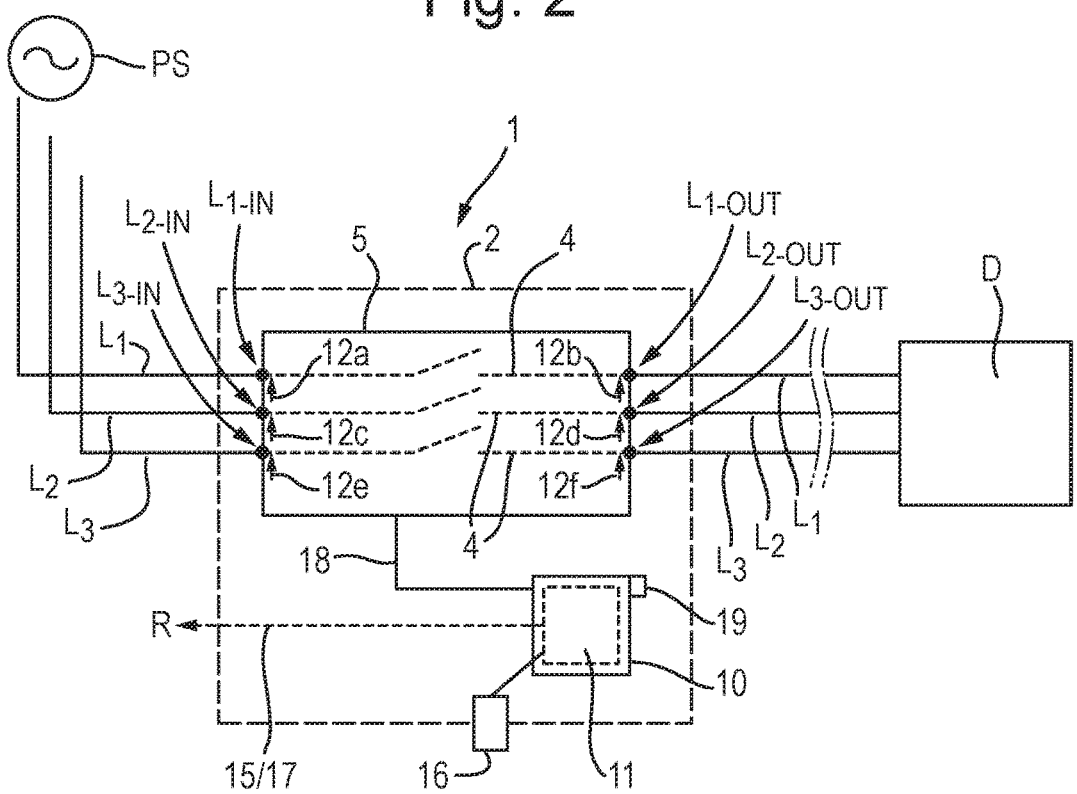
FIG. 2 shows a second embodiment of a fault monitoring system in another exemplary device control centre.

Many other devices such as motors require multi-phase power supply and hence multiple power lines each carrying a different power phase. FIG. 2 shows a second embodiment in which the DCC 1 provides first, second and third power lines of different respective phases $L_1$, $L_2$ and $L_3$. It will be noted that no neutral line $L_n$ is present and this is because a neutral line is not essential where the power supply is multi-phase. The control section 5 is connected between each of the three power lines at three respective pairs of terminals: $L_{1\text{-}IN}$ and $L_{1\text{-}OUT}$, $L_{2\text{-}IN}$ and $L_{2\text{-}OUT}$, and $L_{3\text{-}IN}$ and $L_{3\text{-}OUT}$. The fault monitoring module 10 now includes three corresponding pairs of temperature sensors: 12a and 12b, 12c and 12d, and 12e and 12f, arranged to measure the temperatures of the six terminals (in FIG. 2, the cables connecting the temperature sensors 12 to the processor are not shown, for clarity).

The processor 11 performs the above-described IN-OUT calculation for each of the three power lines $L_1$, $L_2$ and $L_3$. Thus, the difference $\Delta T_{L1}$ between the temperatures of the IN and OUT terminals on the first power line $L_1$ is calculated and compared with a corresponding threshold $\Delta T^*_{L1}$ the difference $\Delta T_{L2}$ between the temperatures of the IN and OUT terminals on the second power line $L_2$ is calculated and compared with a corresponding threshold $\Delta T^*_{L2}$; and the difference $\Delta T_{L3}$ between the temperatures of the IN and OUT terminals on the third power line $L_3$ is calculated and compared with a corresponding threshold $\Delta T^*_{L3}$. Again, these predetermined threshold values may be different from one another but typically will be the same (with the result that only one threshold value need be stored and can be used in all three calculations). The processor 11 is configured to generate one or more output signals based on the calculations and to output the signal(s) to an local output module 16 and/or on remote output line 15/17 (each as described in relation to the first embodiment) so as to communicate the status of the terminals externally. The output signal(s) could include a status signal indicating the overall "health" of the control section 5 which transitions to an alert signal if any one or more of the three IN-OUT calculations indicates a fault. Alternatively the processor may generate three signals, one relating to each power line $L_1$, $L_2$, $L_3$, which may be utilised to control three different alarm devices or to control one alarm device to output different alarms (e.g. colours or flash sequence) depending on which power line is indicating a fault.

Optionally, the processor 11 may again be further programmed to perform the HIGH function described above in relation to the first embodiment. Hence in this case the absolute or ambient-referenced temperatures of each of the six terminals ($T_{L1\text{-}IN}$, $T_{L1\text{-}OUT}$, $T_{L2\text{-}IN}$, $T_{L2\text{-}OUT}$, ... etc.) will be compared against corresponding predetermined threshold values ($T^*_{L1\text{-}IN}$, $T^*_{L1\text{-}OUT}$, $T^*_{L2\text{-}IN}$, $T^*_{L2\text{-}OUT}$, ... etc.) which again may be the same as each other or different. The presence of a fault will be indicated by the measured temperature exceeding the threshold, preferably for a preset time period. The processor 11 will generate one or more output signals accordingly for control of alarm device(s) 16 and/or communication on remote output line 15/17.

Multi-phase power supplies are prone to suffering so-called phase imbalance, in which the power levels on the multiple power lines $L_1$, $L_2$, $L_3$ differ from one another. In devices such as multi-phase motors this can cause substantial damage and significantly shorten the lifetime of the device. In an advantageous embodiment the fault monitoring system can optionally be configured to additionally detect incidents of phase imbalance. Thus in a phase imbalance routine ("PHASE"), the processor 11 calculates the difference between the measured temperature of each IN terminal and each of the other IN terminals, i.e. calculating $\Delta T_{L1/L2\text{-}IN}$ ($=T_{L1\text{-}IN}-T_{L2\text{-}IN}$), $\Delta T_{L2/L3\text{-}IN}$ ($=T_{L2\text{-}IN}-T_{L3\text{-}IN}$) and $\Delta T_{L3/L1\text{-}IN}$ ($=T_{L3\text{-}IN}-T_{L1\text{-}IN}$), and/or the difference between the measured temperature of each OUT terminal and each of the other OUT terminals, i.e. calculating $\Delta T_{L1/L2\text{-}OUT}$ ($=T_{L1\text{-}OUT}-T_{L2\text{-}OUT}$), $\Delta T_{L2/L3\text{-}OUT}$ ($=T_{L2\text{-}OUT}-T_{L3\text{-}OUT}$) and $\Delta T_{L3/L1\text{-}OUT}$ ($=T_{L3\text{-}OUT}-T_{L1\text{-}OUT}$). Each of the calculated differences is compared against a corresponding pre-determined threshold value $\Delta T^*_{L1/L2\text{-}IN}$, etc., which again may be different for each pair of terminals but will more typically all be the same. A calculated difference between the temperature of two IN terminals or two OUT terminals greater than the corresponding threshold is indicative of a phase imbalance existing between the two power lines in question. The processor is configured to generate one or more output signals based on the calculation which are communicated externally via local alarm devices such as 16 and/or on remote output line 15/17. As with the previous functions, the processor may be configured to generate an alarm signal only when the phase imbalance has been indicated for the duration of a preset period of time, e.g. 60 seconds, to avoid false alarming.

The results of the phase imbalance routine could be taken into account in a status signal generated by the processor 11 indicating the overall health of the terminals as mentioned above. In this case the status signal could transition to an alarm signal if any of the IN-OUT, HIGH or PHASE routines identifies a connection fault or phase imbalance. However in preferred examples, multiple output signals are generated such that the output module can indicate to the use not only that there is a fault or phase imbalance but also which of the routines has identified the fault or phase imbalance, and preferably which terminal or power line is indicating the fault or phase imbalance.

In one example, the nature and location of the fault and/or phase imbalance can be indicated locally by implementing the alarm device(s) 16 as a multi-coloured light source (e.g. LED) or as an array of light sources of different colours. For Example, the alarm device 16 could be a three-colour light source capable of emitting e.g. green, yellow and red light (sequentially) under the control of processor 11. The processor may be configured to control the light source 16 to emit green light when there is no alarm condition (i.e. when no fault or phase imbalance has been identified by any of the routines), and to transition to yellow or red light when an alarm condition is active in accordance with the following table:

| Light Source Colour | Light Source State | Meaning |
| --- | --- | --- |
| Green | Solid | All OK (no alarm) |
| Yellow | Solid | PHASE Alarm |
| Yellow | Solid then coded flashing | T Sensor failure and location |
| Red | Solid then coded flashing | IN-OUT fault and location |

-continued

| Light Source Colour | Light Source State | Meaning |
| --- | --- | --- |
| Red | Coded flashing | HIGH alarm and location |
| Unlit | — | Loss of power to Device |

In an example, when the IN-OUT routine identifies a temperature difference (e.g. $\Delta T_{L1}$) between a pair of sensors 12 on the same cable which exceeds the warning threshold ($\Delta T^*_{L1}$) for more than 60 seconds, the LED 16 changes colour from green to red. The LED will be solid red for say 5 seconds, followed by a number of 'flashes' that will indicate the location of the highest temperature sensor in the relevant sensor pair. For instance, a single flash repeated at uniform intervals may designate terminal $L_{1\text{-}IN}$, a double flash repeated at uniform intervals may designate terminal $L_{1\text{-}OUT}$, and so on. When the HIGH route indicates that the temperature of any sensor 12 exceeds the relevant threshold then the LED 16 changes colour from green to red and flashes continuously, e.g. at a different frequency from any of the above-mentioned coded sequences. If the PHASE routine identifies a temperature difference between two IN or two OUT sensors which is greater than the corresponding threshold for more than 60 seconds, the LED 16 is illuminated solid yellow. Optionally this could be followed by a flashing code to indicate which of the power lines the phase imbalance exists between.

As shown in the above table, the LED 16 can optionally also be used to indicate if any of the temperature sensors 12 have failed, which will be detected by the processor 11 as either an open-circuit or a short-circuit. Again, the open-circuit or short-circuit condition may need to be detected for a preset time period e.g. 60 seconds, before an alarm signal will be generated. In this example, the LED 16 is lit solid yellow for 5 seconds followed by a number of coded 'flashes' that will indicate the location of the faulty sensor.

All of the alarms are preferably "latching" so that if an alarm event disappears (e.g. a measured temperature or calculated temperature differences falls back below the relevant threshold), the alarm will not clear automatically but remains in place until reset by an operator.

It should be noted that both the HIGH and PHASE routines are optional and can be implemented independently of one another. That is, the processor 11 may be configured to perform either, both or neither of the HIGH and PHASE routines alongside the IN-OUT routine.

Other features of the second embodiment indicated using the same reference numerals in FIG. 2 as used in FIG. 1 are the same as in the first embodiment and will therefore not be described again.

Figure 3:
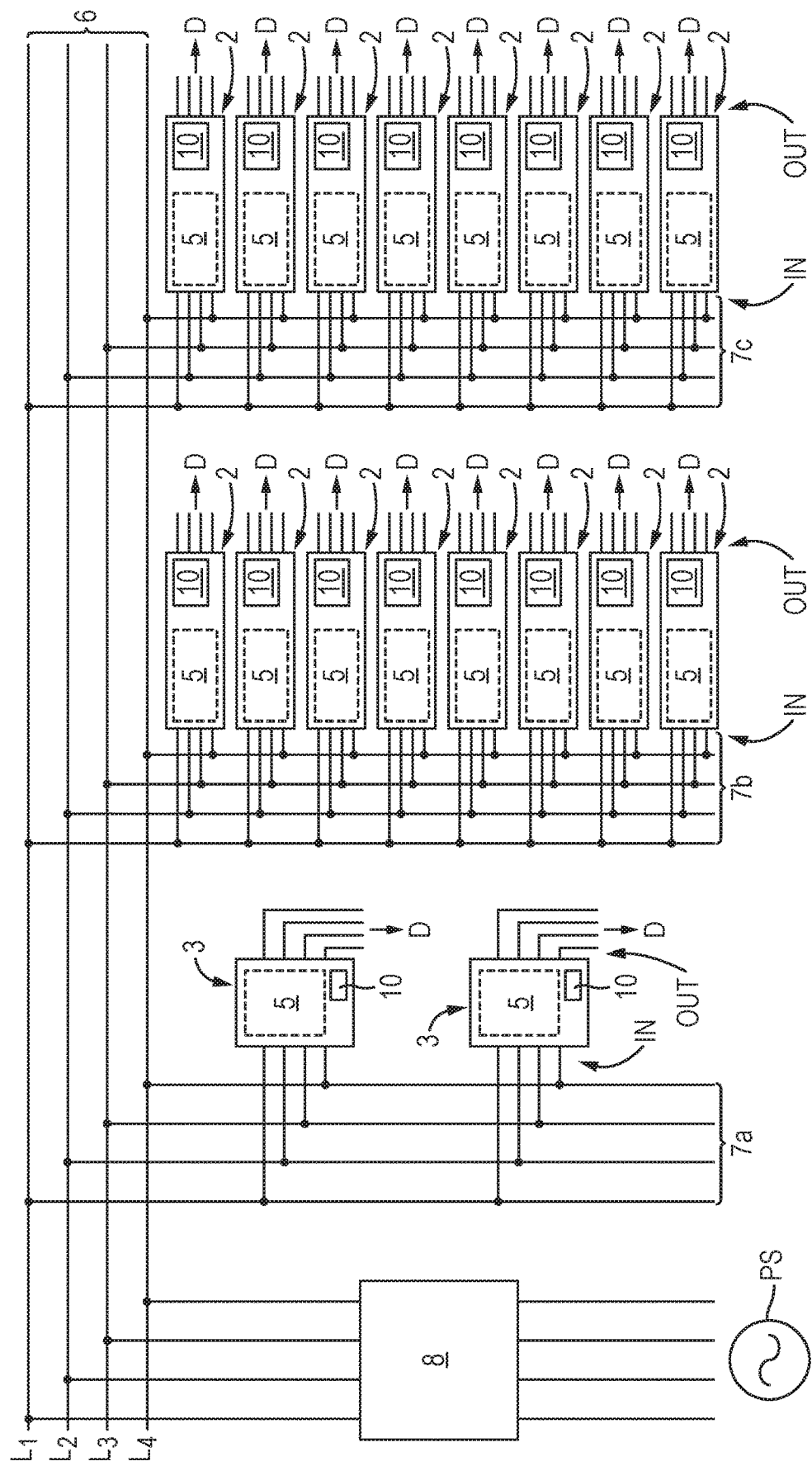
FIG. 3 schematically depicts a further example of a device control centre with a fault monitoring system.

The device control centres (DCCs) 1 described so far have been configured for the control of a single device D. However in practice the DCC 1 will typically be configured to control a plurality of devices D via a corresponding plurality of control sections 5, each optionally being housed in a separate case 2 such as a drawer or bucket. FIG. 3 shows a schematic power circuit diagram for such a DCC 1 controlling the supply of power from a power source PS to multiple devices D. The DCC 1 could be, for instance, a motor control centre (MCC), a power distribution unit (PDU), a Power Distribution Cabinet (PDC), a Power Control Cabinet (PCC), a Remote Power Panel (RPP), a fuseboard, or a switchboard. Whilst all the devices D are designated with the same identifier in the Figure, in practice they are likely to include a mixture of different device types, such as motors, lighting circuits, pumps, compressors etc. Each device (or type of device) D may have different power supply requirements and/or control requirements. For example, some of the devices may require single-phase power, others multi-phase, and some may require a return (neutral) conductor line $L_n$ whereas others may not. Thus, whilst all of the devices D are depicted in FIG. 3 as being connected to four power lines $L_1$, $L_2$, $L_3$ and $L_4$, this may not be the case in practice. Similarly, whilst all of the control sections 5 are identically depicted, in practice the functionality of the control sections may differ depending on the requirements of the device D to which the control section is connected. Some exemplary control sections 5 will be described in more detail below.

Of the fault monitoring system, only the locations of the fault monitoring modules 10 are indicated in FIG. 3 and the other components of the system such as the temperature sensors, processors or output modules (which may form part of the fault monitoring modules) are not shown, for clarity. These can be implemented as discussed above in the first and/or second embodiments in respect of each control section 5, further examples of which will be described below. FIG. 3 also does not depict any communication lines which may optionally be provided between the fault monitoring modules 10 and/or to a remote device or network. Examples of this will be provided below in relation to FIGS. 10 and 11.

Thus, the DCC 1 receives input power from a power supply PS on first, second and third power lines $L_1$, $L_2$, $L_3$ at three different respective phases. A neutral or return line $L_n$ is also provided. The input power is received from the power source PS via an optional main incomer 8 which may include, for example, a switch or circuit breaker. The incoming power is distributed across the DCC along respective power lines provided in a bus 6, and branches 7a, 7b and 7c supply power from the bus to respective columns of control sections 5. For instance, each branch 7a, 7b, 7c may comprise a set of vertical conductors, one for each power line $L_1$, $L_2$, $L_3$, $L_n$, to which each of the control sections 5 in the column connects at its IN terminals.

Each of branches 7b and 7c is depicted as supplying power to a respective column of control sections 5 which here are contained in individual cases 2, which could be removable drawers or non-removable "buckets". Exemplary implementations of each are described below with reference to FIGS. 4 and 5 respectively. On branch 7a, different control sections 5 in cases 3 are depicted, which comprise outgoing feeders such as circuit breakers suitable for supplying devices of varying loads. An example of this is provided below in relation to FIG. 6.

Figure 4:
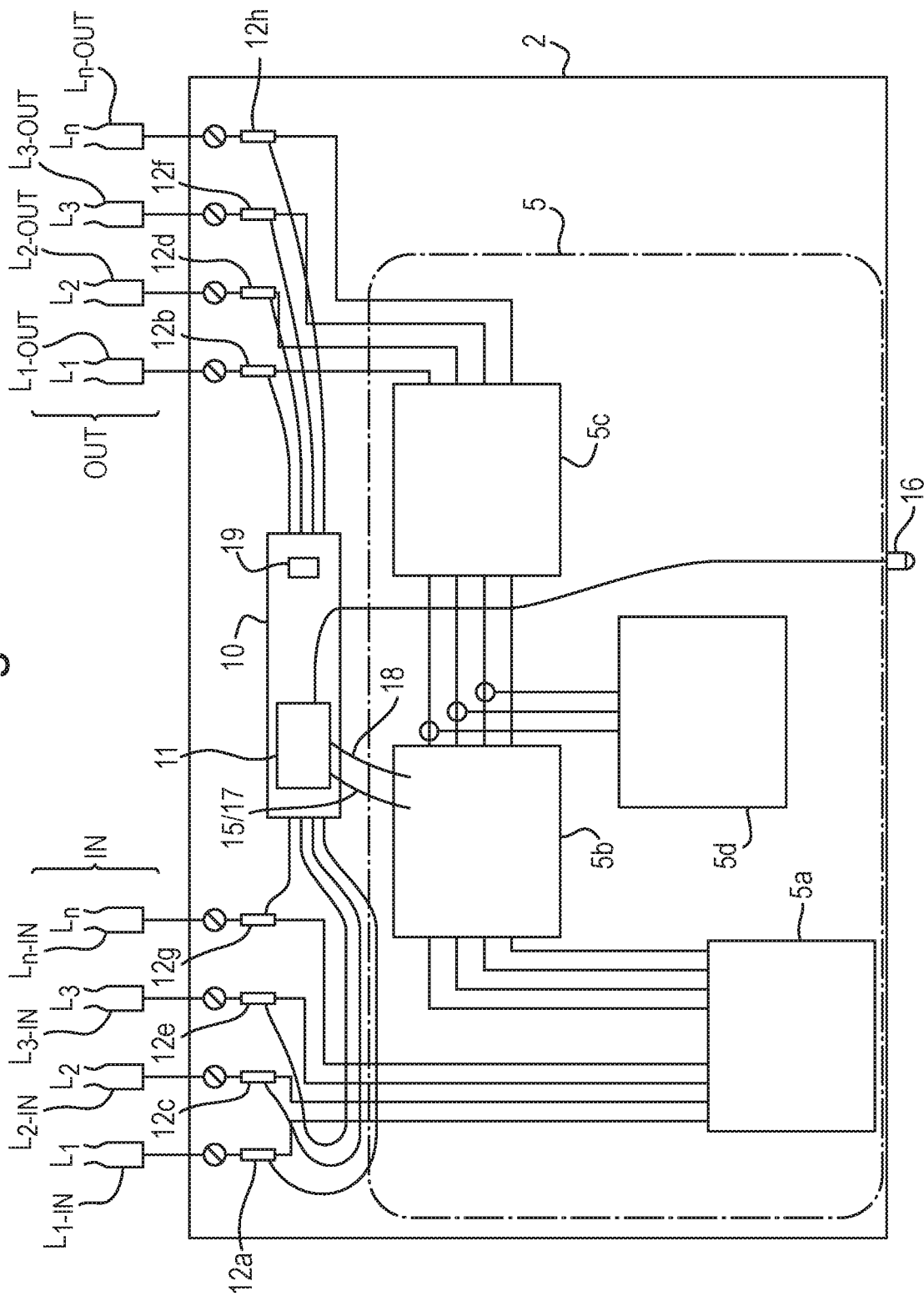
FIG. 4 shows exemplary contents of one of the cases of the device control centre of FIG. 3 in one embodiment.

Turning to FIG. 4, a schematic diagram of the contents of a drawer 2 in one embodiment is shown. At the rear of the drawer, a series of connection terminals is provided: four IN terminals for connection to the power supply side of the respective power lines $L_1$, $L_2$, $L_3$ and $L_n$; and four OUT terminals for connection to the device side of the respective power lines $L_1$, $L_2$, $L_3$ and $L_n$. Physically, the terminals each comprise a set of spring loaded "jaws" or similar removable connection solution forming a clamp which can be fitted onto the DCC conductors (IN terminals) and onto conductors connected to the respective device D (OUT terminals). Between the IN and OUT terminals, the four power lines are routed between various switchgear components 5a, 5b and 5c forming control section 5. In this example, component 5a is the main isolator and is mounted to the front surface of the drawer 2. Component 5b is a control device such as a contactor, a Variable Frequency Drive (VFD) or a soft-starter. Component 5c is a unit providing thermal/magnetic overload protection. It will be appreciated that the switchgear components illustrated are merely exemplary and in other cases the control section 5 could comprise any other suitable switchgear, or only one or some of the examples indicated. In this example, the control section 5 also comprises an optional metering device 5d, e.g. for measuring the voltage and/or current carried by at least some of the power lines.

The fault monitoring module in this example comprises a processor 11 which receives measured temperatures from eight temperature sensors 12a, . . . 12h, each of which is arranged to detect the temperature of one of the IN or OUT terminals as shown. The fault monitoring module here also includes a local alarm device 16 in the form of a multi-coloured LED positioned on the front panel of the drawer or bucket 2 for alerting an operator to an alarm event or otherwise communicating the status of the terminals. The processor 11 receives power via a DC connection 18 to the control section 5 (here provided by control device 5b) and optionally outputs output signal(s) via a remote output line 15/17 connected to a communications port also available on the control section 5. This and other remote communication options will be discussed further below with reference to FIGS. 7, 10 and 11. An ambient temperature sensor 19 may optionally be provided as discussed previously.

The processor 11 is configured to perform the IN-OUT function, and optionally the HIGH and/or PHASE functions, on the temperatures measured by sensors 12a to 12h, in the same manner already discussed above with respect to FIGS. 1 and 2. If a fault or phase imbalance event is identified, the LED 16 is controlled by the processor 11 in the manner previously described, and optionally output signals are also conveyed externally on communications line 15/17.

Figure 5:
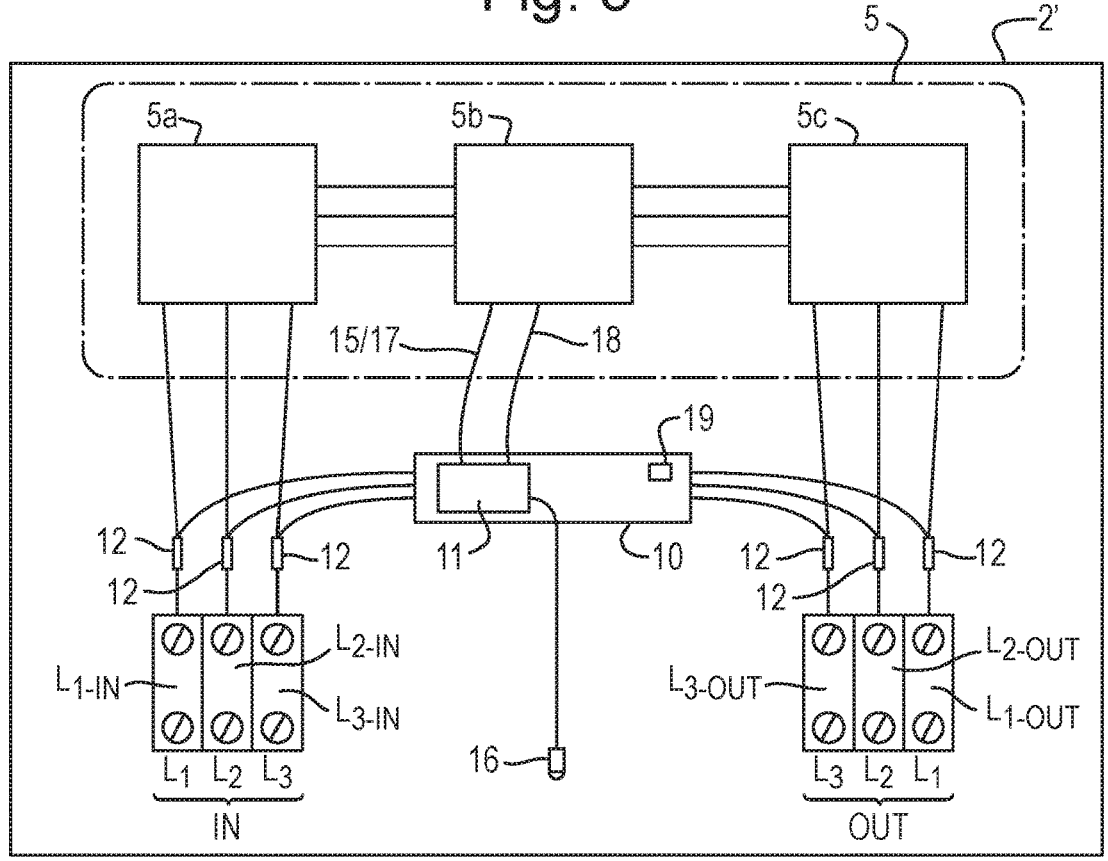
FIG. 5 shows exemplary contents of one of the cases of the device control centre of FIG. 3 in another embodiment.

FIG. 5 is a schematic diagram of the contents of a bucked 2' in another embodiment. Here, the bucket 2' is not intended to be removable in everyday use and so the IN and OUT terminals are configured as bolted or terminal style connections onto the vertical conductors (IN) and device conductors (OUT), rather than spring-loaded jaws. This embodiment also differs from that of FIG. 4 in that only three phase power is provided on three lines $L_1$, $L_2$ and $L_3$, and no neutral line is provided (although this may be provided in other bucket style implementations depending on device requirements). The remaining features of the embodiment are the same as already described and the processor 11 is configured to perform the IN-OUT routine and optionally the HIGH and/or PHASE routines as already described.

Figure 6:
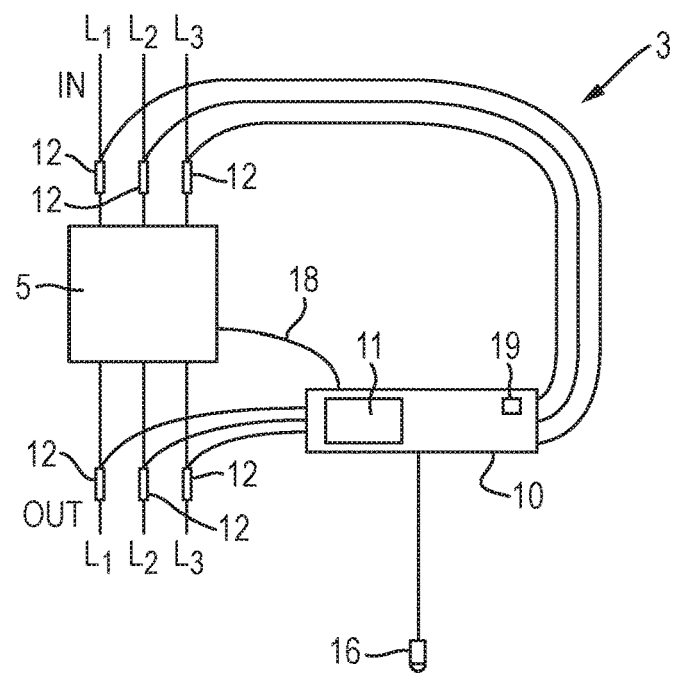
FIG. 6 shows exemplary contents of one of the cases of the device control centre of FIG. 3 in a further embodiment.

FIG. 6 schematically shows a circuit breaker 3 such as may be deployed on branch 7a of the DCC shown in FIG. 3. Typically this too will be contained in a case (not shown in FIG. 6). The control section 5 is hard wired between the power supply side of the three power lines $L_1$, $L_2$ and $L_3$ (IN terminals) and the device side of the same three lines (OUT terminals). A fault monitoring module equipped with temperature sensors 12 is provided as before to detect the temperatures of the six terminals and to perform the IN-OUT (and optionally HIGH and/or PHASE) routines as already described to identify the presence of connectivity faults and/or phase imbalance. In this example, only a local output device 16 is provided and no remote output line, but in other implementations such a remote line 15/17 can also be added.

Two exemplary implementations of fault monitoring modules 10 which can be used in any of the above embodiments will now be described with reference to FIGS. 7(a) and 7(b). Both of these exemplary implementations include a local processor 11 which is pre-programmed to perform at least the IN-OUT routine described above and optionally the HIGH and/or PHASE routines. However as mentioned above in other embodiments this level of processing may be performed centrally, e.g. at a computer to which all of the fault monitoring modules 10 are connected. Such implementations will be discussed further below.

In both the FIGS. 7(a) and 7(b) embodiments, the processor 11 is provided on a circuit board or the like, preferably encased in a housing 10a which is equipped with appropriate access points for making connections with each of the components described below. The housing 10a is preferably sized so as to occupy minimal space within the DCC case, e.g. having maximum dimensions of 80×60×20 mm. The housing 10a is preferably designed with a DIN rail mount on its narrow face.

The aforementioned temperature sensors 12 (of which typically there may be 6) are connected to the processor 11 via cables 13 and a connector 20 which will be described further below with reference to FIG. 8. In both embodiments, power supply input terminals 18a/b are provided for connecting the processor to an alternating or direct current power source, e.g. a 12 to 48V DC power source which may typically be available on control section 5 as mentioned above. Alternatively the terminals 18a/b could be replaced by an onboard power source such as a battery. Also provided in both embodiments are output terminals 16a/b for connection to a local alarm device 16 such as the light source, e.g. LED, mentioned in previous embodiments. In practice, the output terminals 16a/b can be controlled by the processor 11 via a relay output.

Figure 7A:
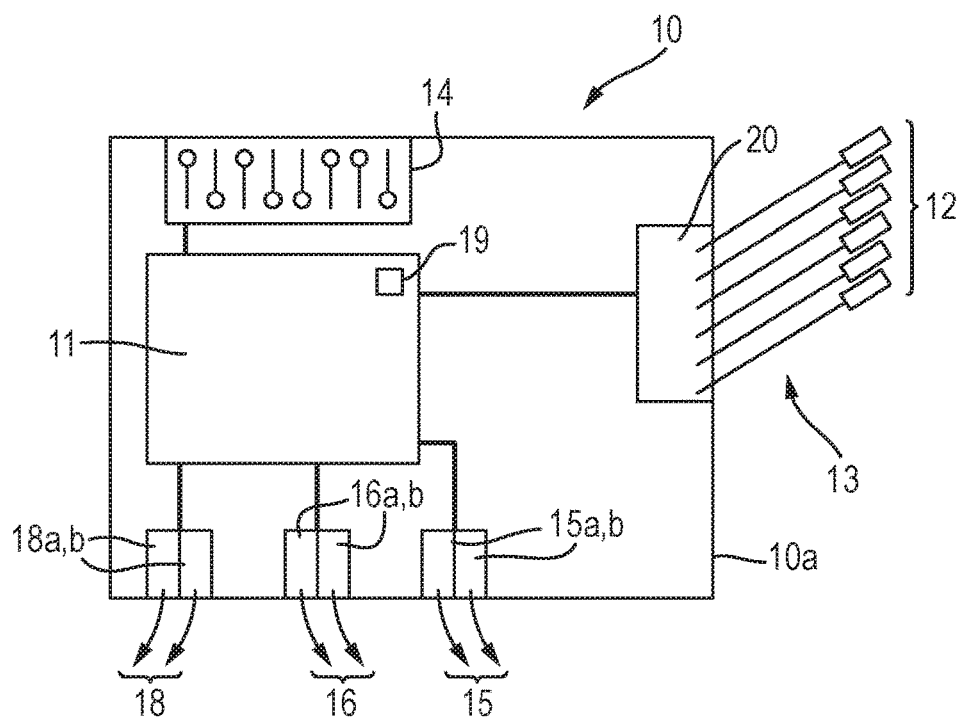
FIGS. 7(a) and 7(b) show two examples of fault monitoring modules in accordance with further embodiments.

Both of the embodiments shown in FIGS. 7(a) and (b) provide for a remote output line via which at least one output signal can be communicated to a remote device. However, the nature and extent of this remote communication differs between the embodiments. In the FIG. 7(a) embodiment, the remote output line 15 is another relay output (preferably a dry relay output contact) which can be used to control a remote alarm device (not shown). For instance, this remote alarm device could be a siren or an indicator on a panel, positioned outside the DCC, which is activated by an alarm signal from processor 11 to indicate the occurrence of a connectivity fault or phase imbalance in the particular control section to which fault monitoring module 10 is attached. In another example, the relay output 15 could provide an input to a remote computer which is configured to alert a user to the presence of a fault or phase imbalance by reporting the receipt of an alarm signal on line 15, e.g. by sending a message to a user and/or by indicating a fault on a graphical user interface representative of the DCC. The relay output 15 can be controlled by the processor 11 in the same manner as has been described above in relation to its control of the local alarm device 16, e.g. so as to provide information in the signal as to which of the IN-OUT, HIGH or PHASE routines has indicated the fault or phase imbalance and, optionally as to which terminal has the fault. However, no further information such as the measured or calculated temperature data can be output via relay line 15.

Figure 7B:
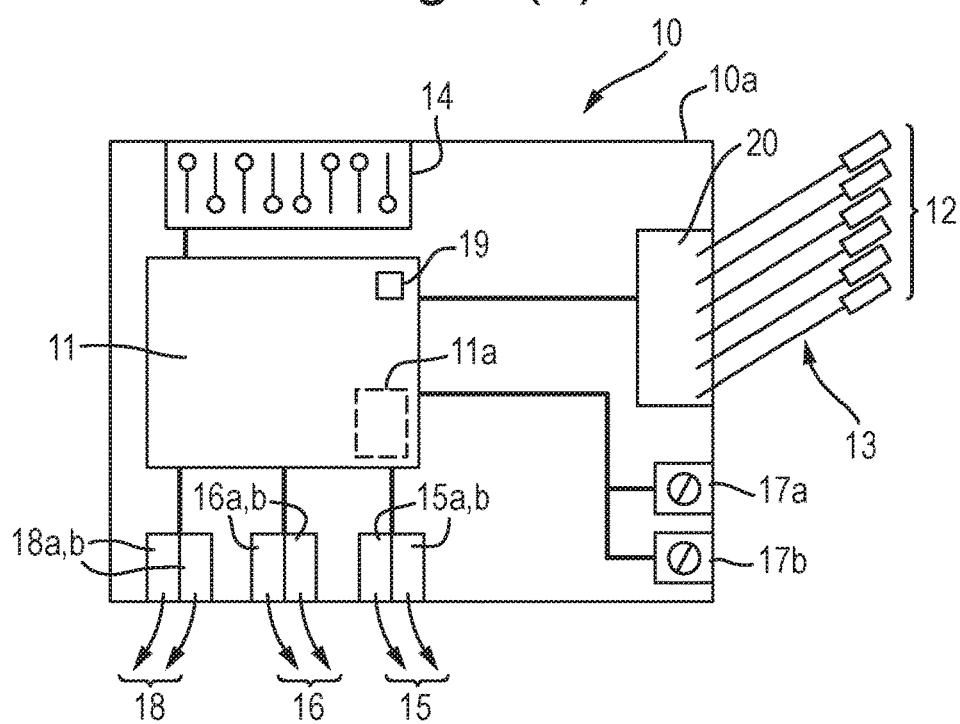

The embodiment of fault monitoring module 10 shown in FIG. 7(b) is equipped with more sophisticated communications functionality, in addition to local alarm line 16 and relay output 15 (or as an alternative). The processor 11 is provided with an output module including a communications device 11a which is configured to convert data output by the processor into a suitable communications protocol, preferably a serial communications protocol such as MOD-BUS. In practice this functionality may be subsumed into that of the processor 11 itself. One or more data lines 17 are provided for connecting the module 10 to a remote device or network operating on the said data protocol. For instance, in the FIG. 7(b) embodiment, items 17a and 17b are two screw terminals for connection of a MODBUS RS485 daisy-chained network. Of course, any other data protocol could be used but a non-proprietary serial data protocol such as MODBUS is preferred because it will be supported by a wide range of DCC manufacturers across many industries.

The data output on the data lines 17a, 17b and/or 17c could be one or more of the output signal(s) generated by the processor 11 already discussed above, e.g. one or more status signal(s) indicating either an alarm or non-alarm event. Alternatively or in addition, the outputs on lines 17a, 17b and/or 17c could comprise temperature data such as any of: the measured temperatures from sensors 12 (optionally referenced against the ambient temperature), or any temperature differences calculated by the IN-OUT or optional HIGH or PHASE routines. In this way additional information as to the state of the terminals, e.g. the magnitude of any temperature increase, can be obtained thereby allowing more accurate monitoring. Examples of networks to which the module 10 can be connected via lines 17a, 17b and/or 17c will be described below.

The data connection enabled by lines 17a, 17b and/or 17c can optionally also be used to upload data to module 10, e.g. to update the software on processor 11 and/or to set certain parameters such as the various thresholds mentioned above such as $\Delta T^*_{L1}$, etc., used in the IN-OUT routine, $T^*_{L1\text{-}IN}$, etc., used in the HIGH routine, and/or $\Delta T^*_{L1/L2\text{-}IN}$, etc., used in the PHASE routine, as well as the optional preset time periods for which an alarm event must be detected before an alarm signal will be output. In such embodiments, these values can be stored in memory in processor 11 and written thereto using known techniques by sending appropriate commands to processor 11 via the selected network protocol.

However, in preferred examples, values such as the above-mentioned thresholds may either be factory-set, or user-selectable from a list of factory-set options. This is particularly advantageous in embodiments such as that of FIG. 7(a) in which there is no data input available, but is still the preferred implementation in embodiments such as that of FIG. 7(b) where such communication is possible, since installation is more straight forward and less prone to user error.

Therefore, in all embodiments, the module 10 is preferably provided with a suitable user input such as a series of switches (e.g. either rotary or DIP switches) 14 which can be used to set the value(s) of selected thresholds for use in the above-mentioned calculations. This enables the user to tailor the fault monitoring system to the particular circumstances of the installation, e.g. to select a higher or lower level of fault sensitivity and/or to account for unusually high or low ambient temperatures. In the examples shown in FIGS. 7(a) and (b), a set of eight DIP switches 14 is provided which can be used by the installer to set the values of the IN-OUT threshold $\Delta T^*_{Lm}$ (the same threshold value being used in relation to each power line $L_m$ should more than one be provided), the HIGH threshold $T^*L_m$ (the same threshold value being used for every terminal), and the PHASE threshold $\Delta T^*_{Lx/Ly\text{-}IN}$ (the same threshold value being used for each pair of power lines).

For instance, the first three switches (each of which can be set to a value of either "1" or "0") can be used to select the IN-OUT threshold value from a list of pre-stored options, e.g.:

| Switch Positions | $\Delta T^*_{Lm}$ |
|---|---|
| 0, 0, 0 | 10° C. |
| 0, 0, 1 | 14° C. |
| 0, 1, 0 | 18° C. |
| 0, 1, 1* | 22° C. |
| 1, 0, 0 | 26° C. |
| 1, 0, 1 | 30° C. |
| 1, 1, 0 | 34° C. |
| 1, 1, 1 | 38° C. |

The starred entry 0, 1, 1 (=22 degrees C.) indicates the preferred default setting with which the module 10 may leave the factory.

Similarly, the fourth, fifth and sixth switches of block 14 can be used to select the HIGH threshold value from a list of pre-stored options, e.g.:

| Switch Position | $T^*_{Lm}$ |
|---|---|
| 0, 0, 0 | 55° C. |
| 0, 0, 1 | 60° C. |
| 0, 1, 0 | 65° C. |
| 0, 1, 1* | 70° C. |
| 1, 0, 0 | 75° C. |
| 1, 0, 1 | 80° C. |
| 1, 1, 0 | 85° C. |
| 1, 1, 1 | 90° C. |

Again, the starred entry 0, 1, 1 (=70 degrees C.) indicates the preferred default factory setting.

The last two switches (seventh and eighth) can be used to select the PHASE threshold value from four prestored options, e.g.:

| Switch Position | $\Delta T^*_{Lx/Ly\text{-}IN}$ |
|---|---|
| 0, 0 | 10° C. |
| 0.1* | 14° C. |
| 1, 0 | 18° C. |
| 1, 1 | 22° C. |

Where the module 10 is provided with a data output 17 for connection to a network, the network address of the module 10 will also need to be set. If one or more of the above threshold values is to be set by other means (e.g. writing directly to the processor 11 via the communications channels), some of the switches in block 14 could be used for this purpose. Alternatively, another set of switches could be provided for the installer to set the network address. For example, a set of 5 switches can be used to select a network address between 1 and 31, by assigning each switch a value as shown below. The assigned address will be the sum of the switches which the installer sets to "1":

| Switch | Modbus slave values |
|---|---|
| 1 | 1 |
| 2 | 2 |
| 3 | 4 |
| 4 | 8 |
| 5 | 16 |

In embodiments of this sort equipped with a network communications functionality, the processor 11 will typically be programmed in accordance with the selected protocol (e.g. MODBUS) to hold each item of data in a register assigned accordingly. In one example, the following MODBUS registers could be provided:

| Register | Type | Access | Data Size | Description |
|---|---|---|---|---|
| 1 | Coil Boolean | Read only | Bit | IN-OUT Alarm |
| 2 | Coil Boolean | Read only | Bit | HIGH Alarm |
| 3 | Coil Boolean | Read only | Bit | PHASE Alarm |
| 4 | Coil Boolean | Read only | Bit | Sensor failure Alarm |
| 5 | Coil Boolean | Read only | Bit | Aggregate Alarm |
| 6 | Coil Boolean | Read only | Bit | On/Off watchdog |
| 7 | Coil Boolean | Read/Write | Bit | Drawer 'out of service' register |
| 30001 | Input Integer | Read only | 16 bit | Firmware version |
| 30002 | Input Integer | Read only | 16 bit | Serial number - high bits |
| 30003 | Input Integer | Read only | 16 bit | Serial number - low bits |
| 30010 | Input Signed Integer | Read only | 16 bit | $T_{L1\text{-}IN}$ (° C. × 10) |
| 30011 | Input Signed Integer | Read only | 16 bit | $T_{L2\text{-}IN}$ (° C. × 10) |
| 30012 | Input Signed Integer | Read only | 16 bit | $T_{L3\text{-}IN}$ (° C. × 10) |
| 30013 | Input Signed Integer | Read only | 16 bit | $T_{L1\text{-}OUT}$ (° C. × 10) |
| 30014 | Input Signed Integer | Read only | 16 bit | $T_{L2\text{-}OUT}$ (° C. × 10) |
| 30015 | Input Signed Integer | Read only | 16 bit | $T_{L3\text{-}OUT}$ (° C. × 10) |
| 30016 | Input Signed Integer | Read only | 16 bit | $T_{AMB}$ (° C. × 10) |
| 40001 | Holding Integer | Read/write | 16 bit | $\Delta T^*_{Lm}$ (° C. × 10). |
| 40002 | Holding Integer | Read/write | 16 bit | $T^*_{Lm}$ (° C. × 10). |
| 40003 | Holding Integer | Read/write | 16 bit | $\Delta T^*_{Lx/Ly\text{-}IN}$ (° C. × 10) |

Thus, registers 1, 2 and 3 each indicate "1" (alarm) or "0" (no alarm) according to whether the processor has identified an alarm event based on the IN-OUT function, the HIGH function or the PHASE function respectively. Register 4 indicates "1" if a temperature sensor 12 has been detected as faulty (e.g. due to a short circuit or open circuit), and "0" if not. Register 5 is a "common" alarm register which will set to "0" if no alarm condition exists and to "1" if any one or more of the alarms in registers 1 to 4 exists. Register 6 is a "watchdog" register which toggles continuously between "1" and "0" at a preset interval to enable an external system to confirm that the processor 11 is operational. Register 7 is provided to enable the user to inform the processor whether the control section 5 to which the module 10 containing processor 11 is fitted is in service ("1") or out of service ("0"). By setting the register to out of service, the functions of the fault monitoring module 10 are disabled such that the control section 5 can be worked on, e.g. disconnected, without triggering an alarm.

Registers 30001 to 30003 are multi-bit registers for storage of data such as the version number of the firmware or software with which the processor 11 is programmed, and a serial number of the particular processor.

Registers 30010 to 30016 are multi-bit registers for each of the temperatures measured by the temperature sensors 12a to 12h and the optional ambient temperature sensor 19 ($T_{AMB}$).

Registers 40001 to 40003 are multi-bit registers containing the IN-OUT, HIGH and PHASE threshold values respectively. As described above these may be set via DIP switches 14 local to the processor, or by communication across the network.

In all embodiments, the temperature sensors 12 could be hard wired to the processor 11 or connected via standard terminal blocks, e.g. via a circuit board such as a PCB on which the processor 11 is carried. However, in preferred embodiments a connection assembly 20 is provided via which the temperature sensors can be removably coupled to the rest of module 10. This not only increases the ease of installation but allows for straightforward replacement of the sensors should one become damaged or if a different type of sensor or sensor cable is required. FIGS. 8(*a*) and (*b*) show two preferred implementations of such a connection assembly 20. In the FIG. 8(*a*) embodiment, the temperature sensors 12 are hard wired to a multi-pin connection unit (e.g. plug) 22 and a corresponding multi-pin connection unit (e.g. socket) is provided to couple thereto. In this way, all of the sensors 12 can be connected to the processor in one action. This allows for simple testing and connection to the module 10, as well as:

Simple, low cost testing of the sensors 12 prior to shipment;

Reduced assembly time in the factory;

Shortened installation time and reduced skills required by installer;

Improved quality of the connections from the sensors to the processor 11;

Straightforward in-service replacement of any damaged sensors 12; and

Various sensor cable lengths to be supplied, and/or UL variations for the cable 13.

Figure 8A:
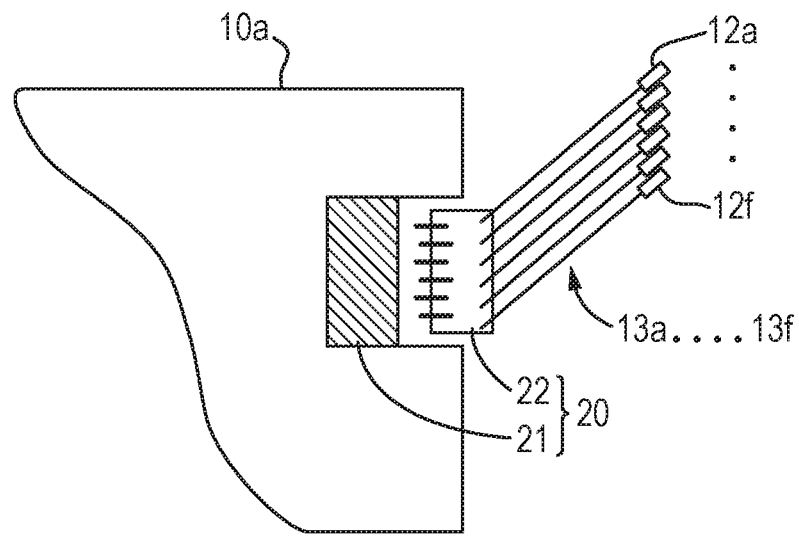
FIGS. 8(a) and 8(b) show portions of two fault monitoring modules in accordance with further embodiments.
Figure 8B:
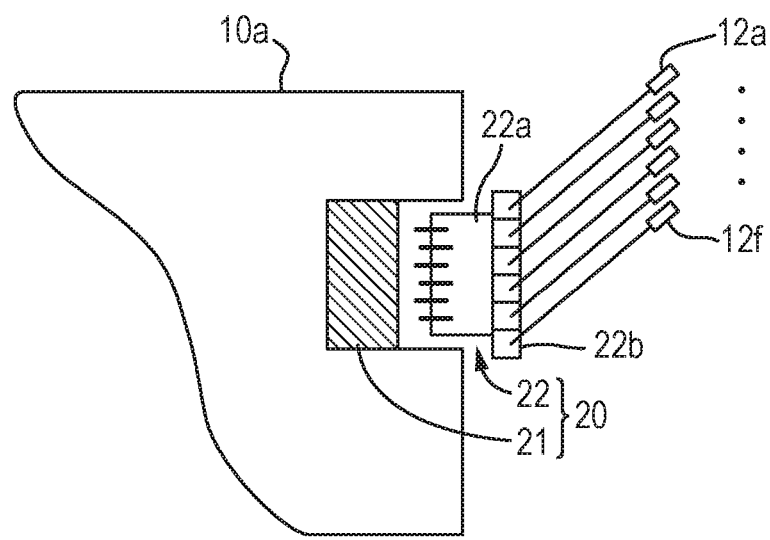

A variant of this embodiment is shown in FIG. 8(*b*). Here the connection unit 22 to which the sensors are connected comprises a set of terminal block connectors 22b (one for each sensor), joined to the multi-pin connector 22a. This enables the installer to select e.g. different sensor cable lengths for each of the sensors.

In all embodiments, it is preferred that the sensors be labelled or otherwise coded (e.g. via choice of cable colour) to indicate which terminal each one is to measure the temperature of, since it is critical that the location of each temperature input is known.

In all embodiments, the temperature sensors 12 themselves (and ambient sensor 19 if provided) could take various different forms and could be deployed in different positions depending on the geometry of the installation. However in all cases the temperature of each terminal should be measured as close to the terminal itself as possible. Since it can be difficult to ensure good physical contact between a sensor and a termination (which may have an irregular shape), it may therefore be preferable to utilise non-contact temperature sensors such as radiation thermometers, e.g. infra-red detectors, sited so as to receive radiation emitted by the respective terminals. In other embodiments it is preferred to use contact temperature sensors such as thermistors or thermocouples (if thermocouples are used then an ambient temperature reference 19 is essential). For instance, thermistor sensors of type 10K3A1 resistance values are suitable.

Contact sensors such as thermistors are preferably mounted as close as possible to the respective terminals, e.g. on one of the cables adjacent the termination. For improved measurement accuracy it is desirable to insulate each temperature sensor from the ambient temperature so that its temperature matches that of the terminal or cable to which it is affixed as closely as possible.

Figure 9A:
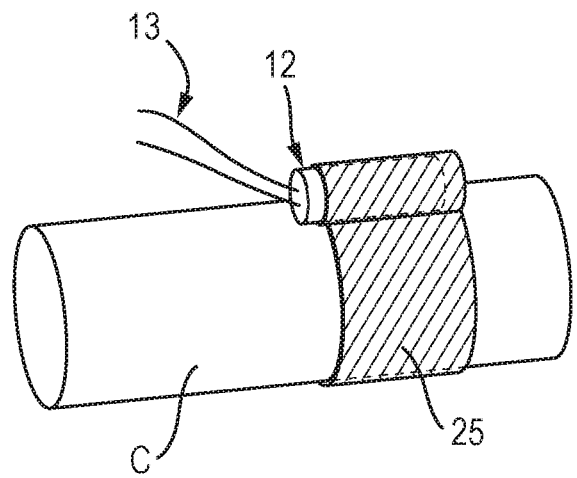
FIGS. 9(a) and 9(b) illustrate two exemplary temperature sensor implementations as may be used in any of the embodiments.
Figure 9B:
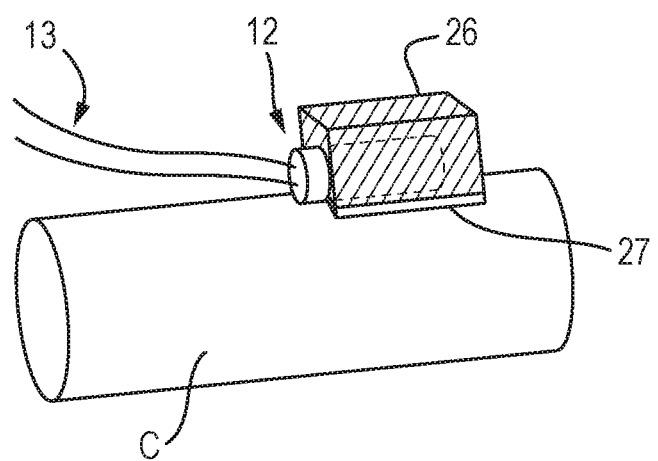

Therefore in preferred embodiments each sensor 12 is provided with a cover formed of a thermally insulating material, arranged to reduce heat transfer between the temperature sensor and the ambient environment relative to heat transfer between the temperature sensor and the respective terminal. FIGS. 9(*a*) and (*b*) show two examples of suitable covers. In FIG. 9(*a*) the temperature sensor 12 (here a thermistor) is affixed to the surface of cable C using a thermally insulating adhesive tape 25 which is wrapped around the outside of the sensor 12 and cable C (and preferably does not pass between the cable C and the sensor 12). The material from which the tape 25 is formed preferably comprises a foam or three-dimensional fabric containing pockets of air or other gas to provide increased thermal insulation. FIG. 9(*b*) shows an alternative embodiment in which a cover 26 is provided in the form of a block formed of an insulating material such as plastic. The block 26 is sized so as to house the sensor 12 in a cavity therewithin. The insulating material from which the block 26 is made extends at least around the sides of the sensor 12 which would otherwise be exposed to the ambient conditions. The block 26 may be open on the underlying surface such that there is no insulating material between sensor 12 and cable C, or could have a thinner wall or membrane here for relatively high thermal transfer. The block 26 can be attached to the cable C either using a mechanical means such as a cable tie (not shown) or by a suitable adhesive 27.

As already described, the DCC will typically include a plurality of control sections 5 and preferably each will be provided with a fault monitoring module 10 of one of the sorts described above. Each fault monitoring module could simply provide a local output such as the alarm device 16 mentioned above. However, more preferably the modules 10 are connected to one or more remote devices so that the occurrence of an alarm event can be notified to persons away from the DCC, or even off-site.

If the modules 10 are provided with relay output lines 15 as described in relation to FIG. 7 above, these outputs can all be connected into a suitable remote device such as a display panel or an input device into a computer network for converting signals on the relay lines 15 into appropriate notifications for users.

Where the modules 10 include communications modules and data outputs 17 (e.g. MODBUS), the modules are preferably each connected to a suitable communications network operating on the selected protocol. An example of such a network is shown in FIG. 10. It should be noted that the power circuitry of the DCC in which the fault monitoring system is deployed (e.g. as shown in FIG. 3) will of course also be present, but is not shown in FIG. 10. Only selected components of the fault monitoring modules 10 are depicted for clarity but in practice each of these can be implemented with any or all of the features described in the embodiments above. Thus, the plurality of fault monitoring modules 10 are connected via data lines 17 to form a network on which also resides at least a controller 31 and preferably one or more user input devices and/or displays such as 32 and 33. Each module 10 communicates with the controller 31 using the selected serial protocol (e.g. MODBUS), outputting data such as alarm status and/or temperature data. The network can also be used to input data to the modules 10 as described previously. Alarms and other data can then be indicated to the users via interfaces 32, 33 on the network.

Networked systems such as that shown in FIG. 10 also lend themselves to alternative implementations in which the above-described processing functions are not performed locally within each module 10 but rather at a remote processor 11', which could for instance form part of controller 31. Thus the local processors 11 in each module 10 could simply convey the temperatures measured by the temperature sensors 12 to the central processor 11' which could then perform the IN-OUT routine (and optionally the HIGH and/or PHASE routines) for each module 10 and generate the necessary output signals for communication to the users via interfaces 32/33 and/or by remotely controlling the alarm devices 16 which may preferably still be located local to each module 10 (via the local processors 11).

An alternative network implementation is shown in FIG. 11. Here, rather than connecting all the modules 10 to the network in series, network aggregators 35 are provided each of which accepts inputs from a subset of the modules 10 and provides communications between that subset and the rest of the network. For example, each unit 35 may be a MODBUS aggregator which accepts up to 32 inputs and provides a simple MODBUS slave device output. The use of aggregators 35 reduces the network traffic and simplifies the installation of the modules 10.

The invention claimed is:

1. A fault monitoring system for detecting connectivity faults in a device control center, the device control center including at least one control section configured to control a supply of electrical power from a power source to a respective at least one device, the or each control section being electrically connected between the power source and the respective device at least at a first pair of terminals, one of the first pair of terminals connecting the control section to the power source side of a first power line and the other of the first pair of terminals connecting the control section to the device side of the first power line such that the control section completes the power circuit of the device, the fault monitoring system comprising:

for the or each control section, at least a first pair of temperature sensors, one of the first pair of temperature sensors being adapted to detect a temperature of one of the first pair of terminals ($T_{L1-IN}$), and the other of the first pair of temperature sensors being adapted to detect a temperature of the other of the first pair of terminals ($T_{L1-OUT}$);

a processor configured to receive the detected temperatures, calculate an IN-OUT difference, the IN-OUT difference being a difference between the temperatures of the first pair of terminals ($\Delta T_{L1}$), compare the calculated IN-OUT difference with a predetermined threshold value ($\Delta T^*_{L1}$), whereby if the calculated IN-OUT difference ($\Delta T_{L1}$) greater than the predetermined threshold value ($\Delta T^*_{L1}$), this is indicative of a connectivity fault at one of the first pair of terminals, and to generate at least one output signal based on results of the comparison; and an output module adapted to receive the output signal(s) generated by the processor and to communicate the output signal(s) externally.

2. The fault monitoring system according to claim 1, wherein the or each control section is additionally electrically connected between the power source and the respective device at a second pair of terminals, the second pair of terminals connecting the control section to the source side and device side of a respective second power line, the first and second power lines carrying power with different respective phases ($L_1$, $L_2$), and the fault monitoring system further comprises:

for the or each control section, a second pair of temperature sensors, one of the second pair of temperature sensors being adapted to detect a temperature of one of the second pair of terminals ($T_{L2-IN}$), and the other of the second pair of temperature sensors being adapted to detect a temperature of the other of the second pair of terminals ($T_{L2-OUT}$);

wherein the processor is further configured to calculate the IN-OUT difference between the temperatures of the terminals in the second terminals ($\Delta T_{L2}$), compare the or each calculated IN-OUT difference with a predetermined respective threshold value ($\Delta T^*_{L2}$), whereby a calculated IN-OUT difference ($\Delta T_{L2}$) greater than the corresponding predetermined threshold value ($\Delta T^*_{L2}$) is indicative of a connectivity fault at one of the respective pair of terminals, and to generate at least one output signal based on results of the comparison between the calculated IN-OUT difference ($\Delta T_{L2}$) and the corresponding predetermined threshold value ($\Delta T^*_{L2}$).

3. The fault monitoring system according to claim 1, wherein the processor is further configured to compare the detected temperature of each of the first pair of terminals ($T_{L1-IN}$, $T_{L1-OUT}$) against a respective predetermined threshold value ($T^*_{L1-IN}$, $T^*_{L1-OUT}$), whereby a detected temperature greater than the corresponding predetermined threshold value is indicative of a connectivity fault at the respective terminal, and to generate at least one output signal based on results of comparisons between the detected temperature and the corresponding predetermined threshold value.

4. The fault monitoring system according to claim 3, wherein the fault monitoring system further comprises an ambient temperature sensor, adapted to detect an ambient temperature $T_{AMB}$, and the processor is further configured to compare the detected temperature of each terminal ($T_{L1-IN}$, $T_{L1-OUT}$, ...) relative to the detected ambient temperature $T_{AMB}$ against a respective predetermined threshold value ($T^*_{L1-IN/AMB}$, $T^*_{L1-OUT/AMB}$, ...), whereby a detected relative temperature greater than the corresponding predetermined threshold value is indicative of a connectivity fault at the respective terminal, and to generate at least one output signal based on results of the comparison between the detected relative temperatures in the corresponding predetermined threshold values.

5. The fault monitoring system according to claim 2, wherein the processor is further configured to calculate an imbalance difference, the imbalance difference being a difference ($\Delta T_{L1/L2-IN}$) between the temperatures of the power source side terminal of the first power line ($T_{L1-IN}$) and the power source side terminal of the second power line ($T_{L2-IN}$), and/or a difference ($\Delta T_{L1/L2-OUT}$) between the temperatures of the device side terminal of the first power line ($T_{L1-OUT}$) and the device side terminal of the second power line ($T_{L2-OUT}$), and to compare the calculated imbalance difference with a predetermined respective threshold value ($\Delta T^*_{L1/L2-IN}$ and/or $\Delta T^*_{L1/L2-OUT}$), whereby a calculated imbalance difference greater than the corresponding predetermined threshold value is indicative of an imbalance between the power supplied on the first power line and the power supplied on the second power line, and to generate at least one output signal based on results of the comparison between the calculated imbalance difference and the corresponding predetermined threshold value.

6. The fault monitoring system according to claim 1, wherein the processor is adapted such that the at least one output signal generated by the processor includes at least one status signal which is an alarm signal if a connectivity fault at one of the terminals or an imbalance between two of the power lines is indicated, and is a no-alarm signal otherwise.

7. The fault monitoring system according to claim 1, wherein the processor is adapted such that the at least one output signal generated by the processor includes detected temperature data which preferably comprises any of: the detected temperatures of one or more of the terminals ($T_{L1\text{-}IN}$, $T_{L1\text{-}OUT}$, ...), and/or one or more calculated temperature differences ($\Delta T_{L1}$, $\Delta T_{L2}$, $\Delta T_{L1/L2\text{-}IN}$, $T_{L1\text{-}IN/AMB}$, ...).

8. The fault monitoring system according to claim 1, wherein the output module comprises a communications device configured to convert the output signal(s) to a network data protocol and to communicate the output signal(s) to an external device via a network, the network data protocol preferably being a serial communications protocol, preferably being MODBUS.

9. The fault monitoring system according to claim 1, wherein the fault monitoring system comprises a fault monitoring module for each of the at least one control sections, each fault monitoring module comprising:
the at least a first pair of temperature sensors for the respective control section;
the processor, wherein the processor is a local processor configured to receive the detected temperatures from the at least a first pair of temperature sensors for the respective control section only; and
the output module, wherein the output module is a local output module.

10. The fault monitoring system according to claim 9, wherein the device control center comprises a plurality of control sections, the fault monitoring system comprising a respective plurality of fault monitoring modules.

11. The fault monitoring system according to claim 10, comprising a network of fault monitoring modules and a controller, wherein each fault monitoring module comprises an output module for communication with the controller across the network, wherein the output module comprises a communication device configured to convert the output signal(s) to a network data protocol and to communicate the output signal(s) to an external device via a network, the network data protocol preferably being a serial communications protocol, preferably being MODBUS.

12. A device control center, comprising at least one control section configured to control the supply of electrical power from a power source to a respective at least one device, the or each control section being electrically between the power source and the respective device at least a first pair of terminals, one of the first pair of terminals connecting the control section to of the power source side of a first power line and the other of the first pair of terminals connecting the control section to the device side of the first power line such that the control section completes the power circuit of the device, and a fault monitoring system in accordance with claim 1.

13. A method for detecting connectivity faults in a device control center, the device control center comprising at least one control section configured to control the supply of electrical power from a power source to a respective at least one device, the or each control section being electrically connected between the power source and the respective device at least a first pair of terminals, one of the first pair of terminals connecting the control section to of the power source side of a first power line and the other of the first pair of terminals connecting the control section to the device side of the first power line such that the control section completes the power circuit of the device, the method comprising:
for the or each control section, detecting a temperature of one of the first pair of terminals ($T_{L1\text{-}IN}$), and the other of the first pair of terminals ($T_{L1\text{-}OUT}$);
in a processor, calculating an IN-OUT difference, the IN-OUT difference being a difference between the temperatures of the first pair of terminals ($\Delta T_{L1}$), comparing the calculated IN-OUT difference with a predetermined threshold value ($\Delta T^*_{L1}$), whereby a calculated IN-OUT difference ($\Delta T_{L1}$) greater than the predetermined threshold value ($\Delta T^*_{L1}$) is indicative of a connectivity fault at one of the first pair of terminals, and generating at least one output signal based on results of the comparison; and
at an output module, receiving the output signal(s) generated by the processor and to communicate the output signal(s) externally.

14. The method according to claim 13, wherein the or each control section is additionally electrically connected between the power source and the respective device at a second pair of terminals, the second pair of terminals connecting the control section to a source side and device side of a respective second line, the first and second power lines carrying power with different respective phases $L_1$, $L_2$, and the method further comprises:
for the or each control section, detecting a temperature of one of the second pair of terminals ($T_{L2\text{-}IN}$), and the other of the second pair of terminals ($T_{L2\text{-}OUT}$); and optionally
in the processor, calculating the IN-OUT difference between the temperatures of the terminals in the second pair of terminals ($\Delta T_{L2}$), comparing the or each calculated IN-OUT difference with a predetermined respective threshold value ($\Delta T^*_{L2}$), whereby a calculated IN-OUT difference ($\Delta T_{L2}$) greater than a corresponding predetermined threshold value ($\Delta T^*_{L2}$) is indicative of a connectivity fault at one of a respective pair of terminals, and generating at least one output signal based on results of the comparison between the calculated IN-OUT difference ($\Delta T_{L2}$) and the corresponding predetermined threshold value ($\Delta T^*_{L2}$).

15. The method according to claim 13, further comprising comparing the detected temperature of each terminal ($T_{L1\text{-}IN}$, $T_{L\text{-}OUT}$) against a respective predetermined threshold value ($T^*_{L1\text{-}IN}$, $T^*_{L1\text{-}OUT}$), whereby a detected temperature greater than the corresponding predetermined threshold value is indicative of a connectivity fault at the respective terminal, and generating at least one output signal based on results of the comparison between the detected temperature and the corresponding predetermined threshold value.

16. The method according to claim 15, further comprising detecting an ambient temperature $T_{AMB}$, comparing the detected temperature of each terminal ($T_{L1\text{-}IN}$, $T_{L1\text{-}OUT}$, ...) relative to the detected ambient temperature $T_{AMB}$ against a respective predetermined threshold value ($T^*_{L1\text{-}IN/AMB}$, $T^*_{L1\text{-}OUT/AMB}$, ...), whereby a detected relative temperature greater than the corresponding predetermined threshold value is indicative of a connectivity fault at the respective terminal, and generating at least one output signal based on results of the comparison between the detected relative temperature and the corresponding predetermined threshold value.

17. The method according to claim 14, further comprising calculating an imbalance difference, the imbalance difference being a difference ($\Delta T_{L1/L2\text{-}IN}$) between the temperatures of the power source side terminal of the first power line ($T_{L1\text{-}IN}$) and the power source side terminal of the second power line ($T_{L2\text{-}IN}$), and/or a difference ($\Delta T_{L1/L2\text{-}OUT}$) between the temperatures of the device side terminal of the first power line ($T_{L1\text{-}OUT}$) and the device side terminal of the second power line ($T_{L2\text{-}OUT}$), comparing the calculated imbalance difference with a predetermined respective threshold value ($\Delta T^*_{L1/L2\text{-}IN}$ and/or $\Delta T^*_{L1/L2\text{-}OUT}$), whereby a calculated imbalance difference greater than the corresponding predetermined threshold value is indicative of an imbalance between the power supplied on the first power line and the power supplied on the second power line, and generating at least one output signal based on results of the comparison between the calculated imbalance difference and the corresponding predetermined threshold.

18. The method according to claim 13, wherein the at least one output signal includes at least one status signal which is an alarm signal if a connectivity fault at one of the terminals or an imbalance between two of the power lines is indicated, and is a no-alarm signal otherwise.

19. The method according to claim 13, wherein the at least one output signal includes detected temperature data which preferably comprises any of: the detected temperatures of one or more of the terminals ($T_{L1\text{-}IN}$, $T_{L1\text{-}OUT}$, ... ), and/or one or more calculated temperature differences ($\Delta T_{L1}$, $\Delta T_{L2}$, $\Delta T_{L1/L2\text{-}IN}$, $T_{L1\text{-}IN/AMB}$, ... ).

20. The method according to claim 13, further comprising converting the output signal(s) to a network data protocol and communicating the output signal(s) to an external device via a network, the network data protocol preferably being a serial communications protocol, preferably being MODBUS.

21. A computer program product storing a sequence of steps configured to perform the method of claim 13.

* * * * *